United States Patent
Yu et al.

(10) Patent No.: US 9,870,612 B2
(45) Date of Patent: Jan. 16, 2018

(54) METHOD FOR REPAIRING A MASK

(71) Applicant: Taiwan Semiconductor Manufacturing Co., Ltd., Hsin-Chu (TW)

(72) Inventors: Shinn-Sheng Yu, Hsinchu (TW); Anthony Yen, Hsinchu (TW); Wen-Chuan Wang, Hsinchu (TW); Sheng-Chi Chin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/254,607

(22) Filed: Sep. 1, 2016

(65) Prior Publication Data

US 2017/0352144 A1 Dec. 7, 2017

Related U.S. Application Data

(60) Provisional application No. 62/346,273, filed on Jun. 6, 2016.

(51) Int. Cl.

| G06K 9/00 | (2006.01) |
|---|---|
| G06T 7/00 | (2017.01) |
| H01L 21/027 | (2006.01) |
| G03F 1/72 | (2012.01) |
| G03F 1/24 | (2012.01) |
| G03F 1/26 | (2012.01) |

(52) U.S. Cl.
CPC .............. *G06T 7/0004* (2013.01); *G03F 1/24* (2013.01); *G03F 1/26* (2013.01); *G03F 1/72* (2013.01); *G06T 7/0081* (2013.01); *H01L 21/0273* (2013.01); *G06T 2207/10004* (2013.01); *G06T 2207/30148* (2013.01)

(58) Field of Classification Search
USPC ........................................................ 382/144
See application file for complete search history.

(56) References Cited

U.S. PATENT DOCUMENTS

| 5,838,433 A * | 11/1998 | Hagiwara | ........ G01N 21/95623 |
|---|---|---|---|
| | | | 356/339 |
| 6,122,046 A | 9/2000 | Almogy | |
| 6,710,847 B1 * | 3/2004 | Irie | ..................... G03F 7/70475 |
| | | | 235/462.05 |
| 7,266,803 B2 | 9/2007 | Chou et al. | |
| 8,161,422 B2 | 7/2012 | Mukherjee et al. | |

(Continued)

OTHER PUBLICATIONS

Cobb, Nicolas Bailey, "Fast Optical and Process Proximity Correction Algorithms for Integrated Circuit Manufacturing", University of California at Berkeley, Spring 1998, 139pps.

(Continued)

*Primary Examiner* — Jerome Grant, II
(74) *Attorney, Agent, or Firm* — Haynes and Boone, LLP

(57) ABSTRACT

A method includes inspecting a mask to locate a defect region for a defect of the mask. A phase distribution of an aerial image of the defect region is acquired. A point spread function of an imaging system is determined. One or more repair regions of the mask are identified based on the phase distribution of the aerial image of the defect region and the point spread function. A repair process is performed to the one or more repair regions of the mask to form one or more repair features.

20 Claims, 23 Drawing Sheets

(56) References Cited

U.S. PATENT DOCUMENTS

| | | |
|---|---|---|
| 8,458,631 B2 | 6/2013 | Lu et al. |
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,195,135 B2 | 11/2015 | Lu et al. |
| 9,746,762 B2 * | 8/2017 | Hamamoto ............... G03F 1/24 |
| 2004/0175633 A1 * | 9/2004 | Shoki ................ B82Y 10/00 430/5 |
| 2007/0083846 A1 | 4/2007 | Chuang et al. |
| 2008/0107970 A1 * | 5/2008 | Tanabe ................ G03F 1/72 430/5 |
| 2008/0170774 A1 * | 7/2008 | Xiong ............ G01N 21/95607 382/144 |
| 2009/0325083 A1 * | 12/2009 | Okubo ................ G03F 1/42 430/5 |
| 2010/0149505 A1 * | 6/2010 | Sewell ................ G03B 27/54 355/67 |
| 2012/0086800 A1 * | 4/2012 | Vladimirsky .......... B82Y 10/00 348/128 |
| 2012/0113416 A1 * | 5/2012 | Lange ............ G01N 21/95607 356/237.5 |
| 2013/0059234 A1 * | 3/2013 | Kamo ................ G03F 1/24 430/5 |
| 2013/0078555 A1 * | 3/2013 | Orihara ................ G03F 1/24 430/5 |
| 2013/0156939 A1 * | 6/2013 | Budach ................ B82Y 10/00 427/8 |
| 2013/0202992 A1 | 8/2013 | Chen et al. |
| 2013/0336574 A1 * | 12/2013 | Nasser-Ghodsi ........ G06T 7/001 382/145 |
| 2014/0065521 A1 * | 3/2014 | Lu ............... G03F 1/24 430/5 |
| 2014/0254913 A1 * | 9/2014 | Pang ................ G03F 1/70 382/144 |
| 2014/0254930 A1 * | 9/2014 | Cheng ................ G06T 5/00 382/167 |
| 2014/0268119 A1 * | 9/2014 | Chu ................ G01N 21/956 356/237.5 |
| 2015/0089459 A1 * | 3/2015 | Liu ............... G03F 7/705 716/53 |
| 2015/0104733 A1 * | 4/2015 | Shih ................ G03F 1/72 430/5 |
| 2015/0128098 A1 * | 5/2015 | Chang ................ G06F 17/5081 716/52 |
| 2015/0205196 A1 * | 7/2015 | Orihara ................ G03F 1/24 430/5 |
| 2015/0286146 A1 | 10/2015 | Chang et al. |
| 2015/0309405 A1 | 10/2015 | Shih et al. |
| 2015/0311075 A1 | 10/2015 | Huang et al. |
| 2015/0378251 A1 * | 12/2015 | Huang ................ G03F 1/22 355/52 |
| 2016/0004153 A1 * | 1/2016 | Shoki ................ G03F 1/24 204/192.13 |
| 2016/0238924 A1 * | 8/2016 | Burkhardt ................ G03F 1/24 |
| 2016/0330826 A1 * | 11/2016 | Niimi ................ H05G 2/003 |
| 2016/0377769 A1 * | 12/2016 | Hamamoto ............... G03F 1/24 355/77 |
| 2017/0131629 A1 * | 5/2017 | Hamamoto ............... G03F 1/60 |
| 2017/0139322 A1 * | 5/2017 | Shen ................ G03F 1/86 |
| 2017/0176851 A1 * | 6/2017 | Peters ................ G03F 1/72 |

OTHER PUBLICATIONS

Stearns, D.G., et al., "Localized defects in multilayer coatings", Thin Solid Films, 446 (2004) pp. 37-49.

Von Bunau, Rudolf M., et al., "Phase Retrieval from defocused Images and Its Applications in Lithography", Jpn. J. Appl., vol. 36 (1997) pp. 7494-7498.

* cited by examiner

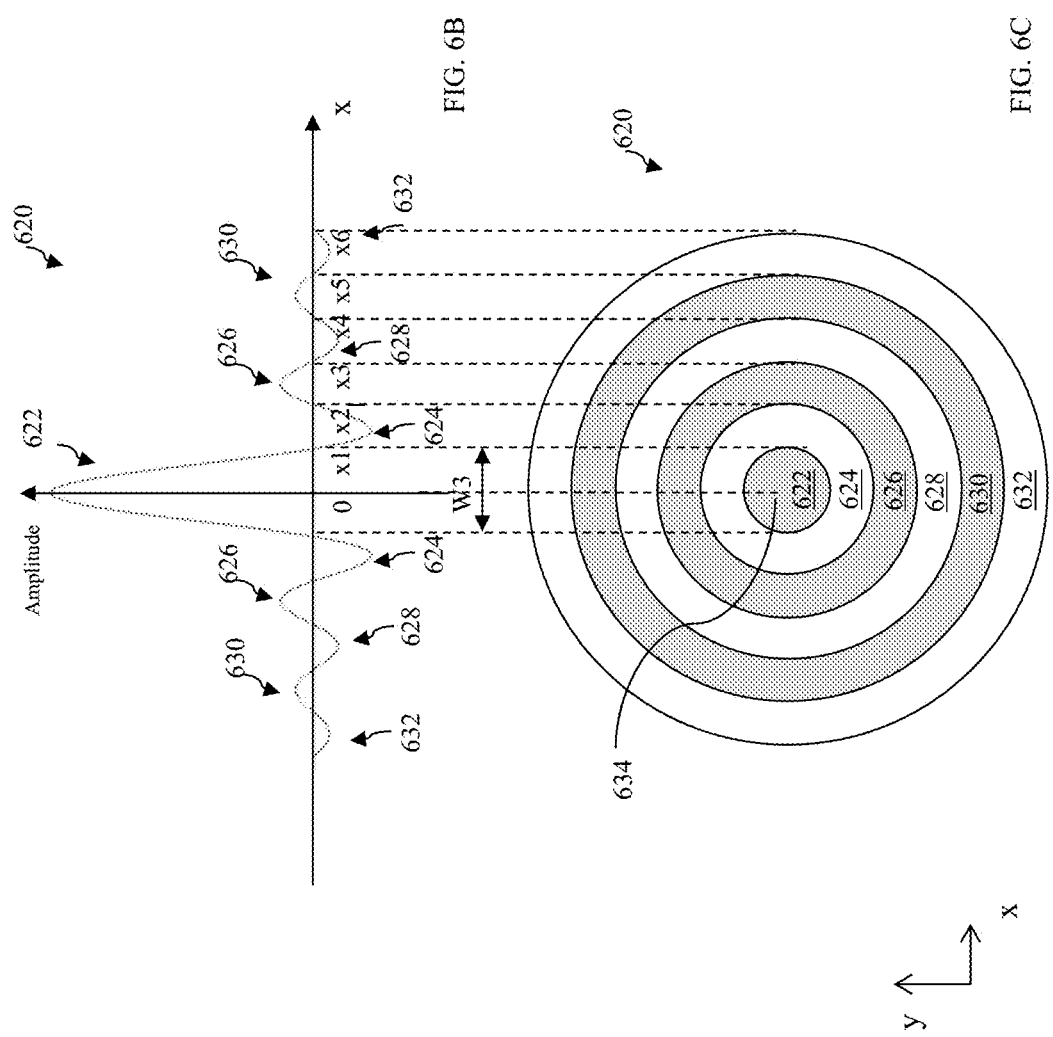

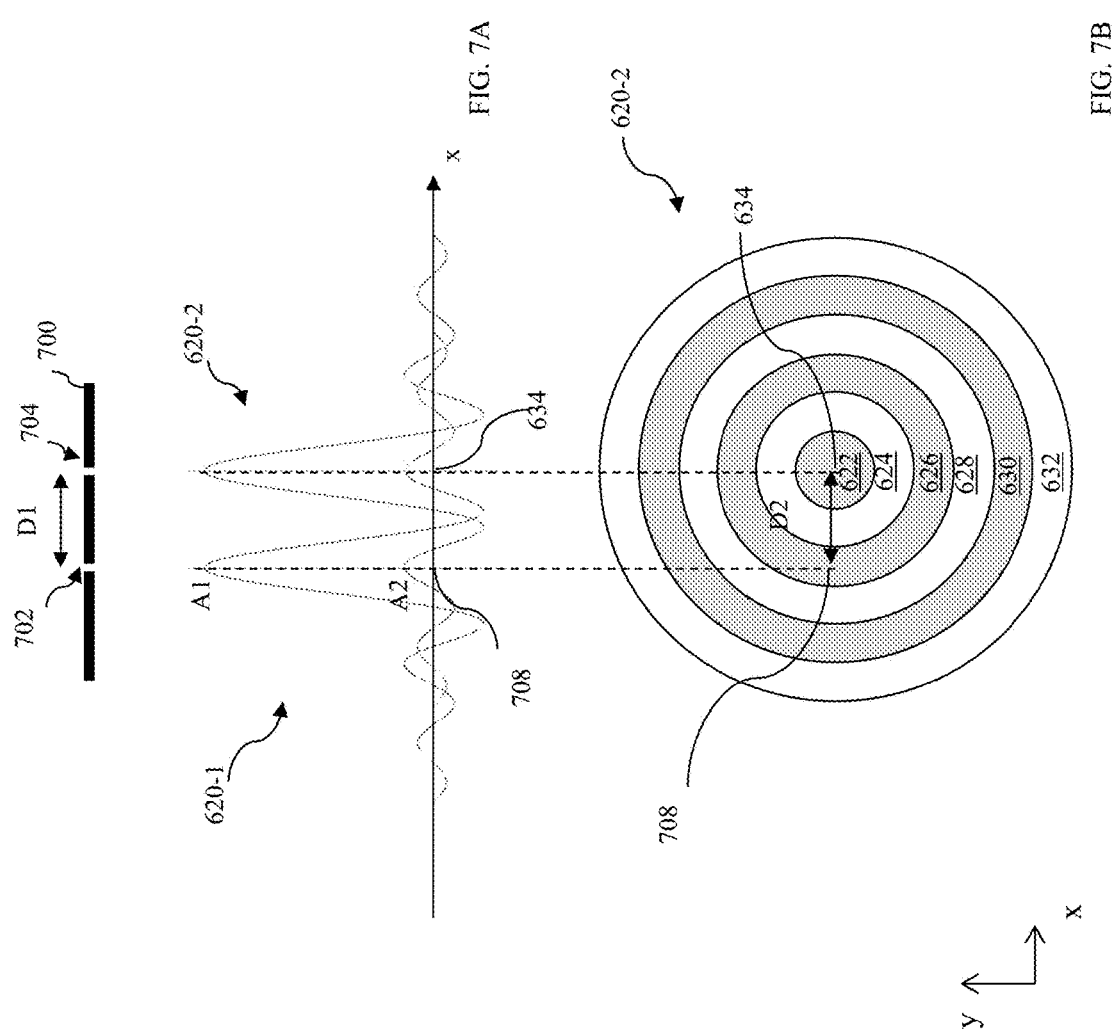

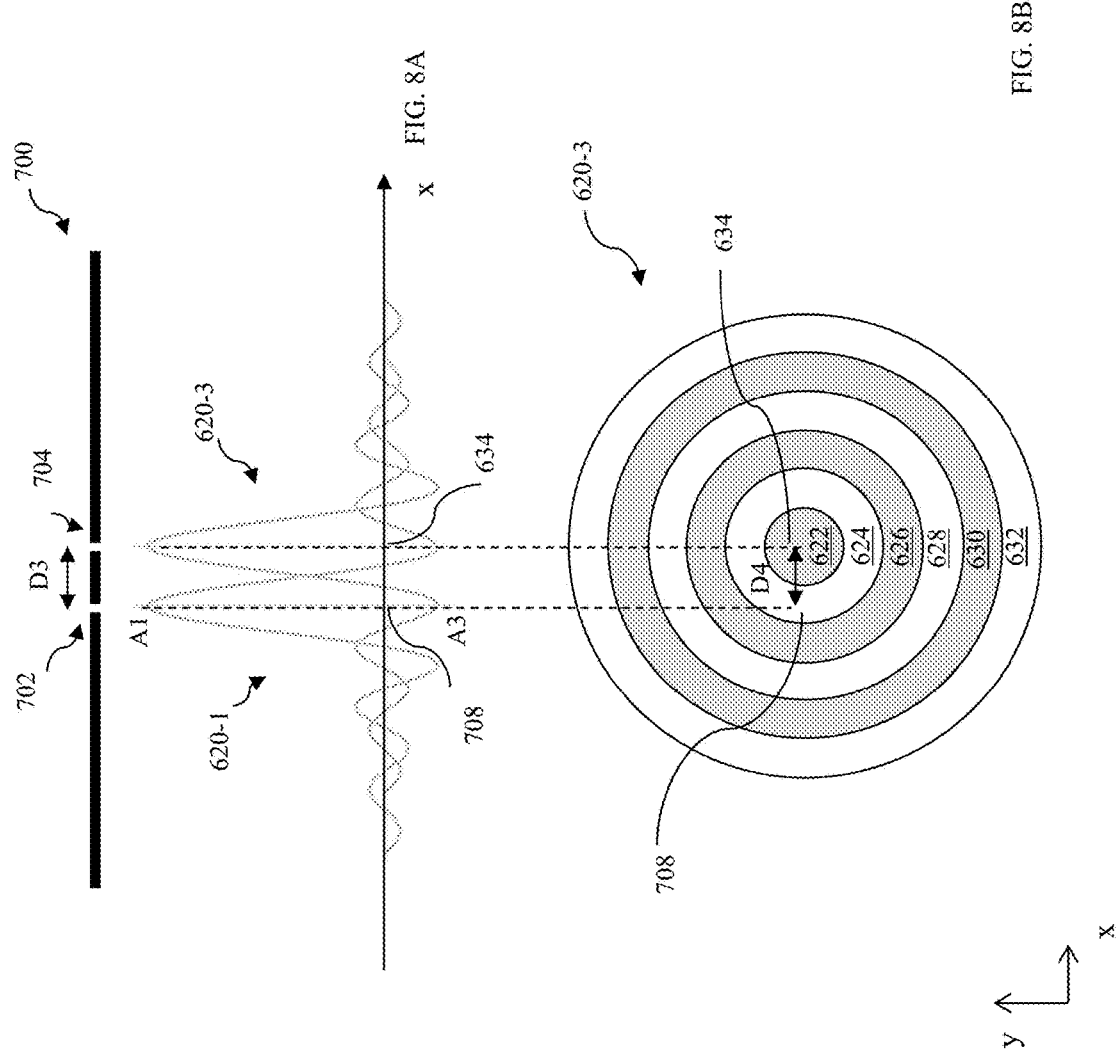

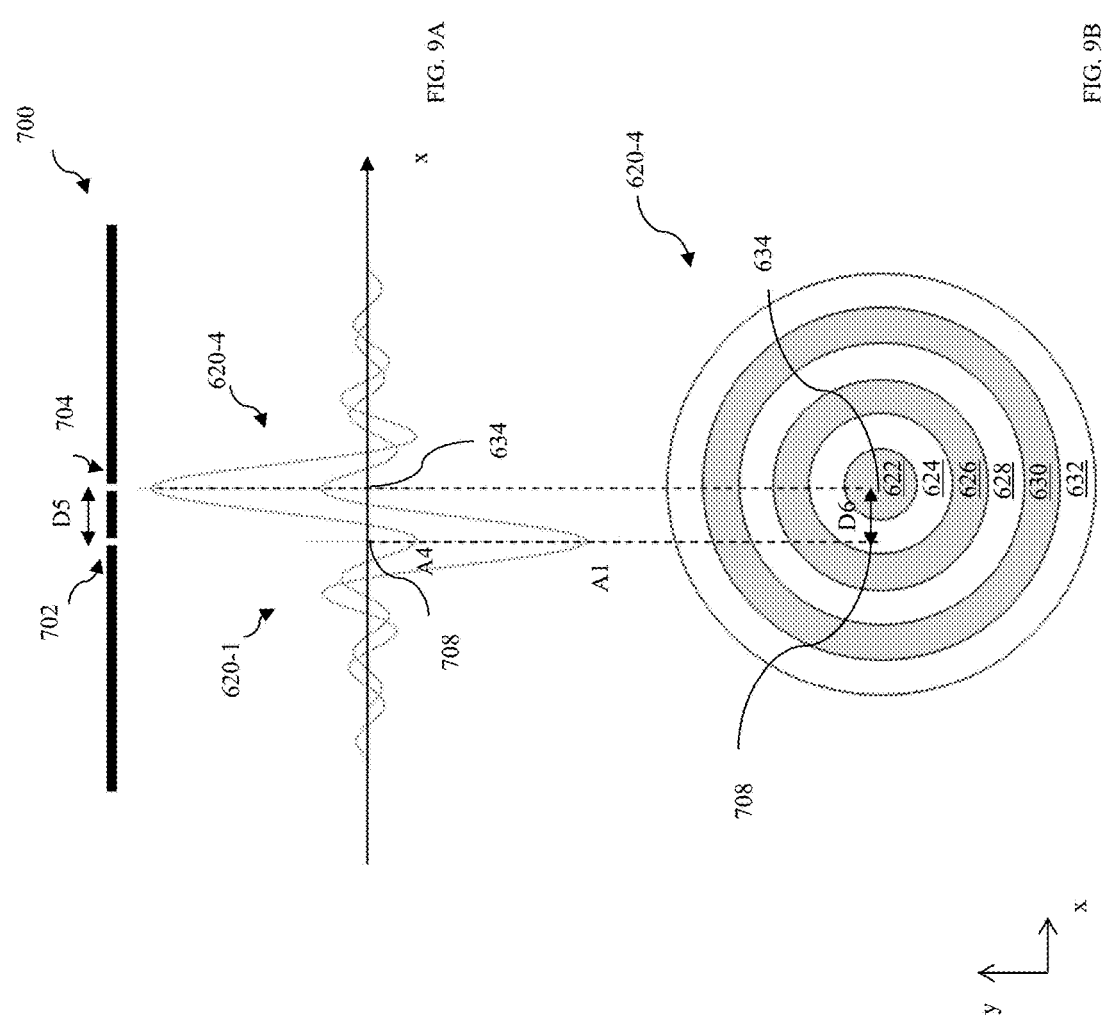

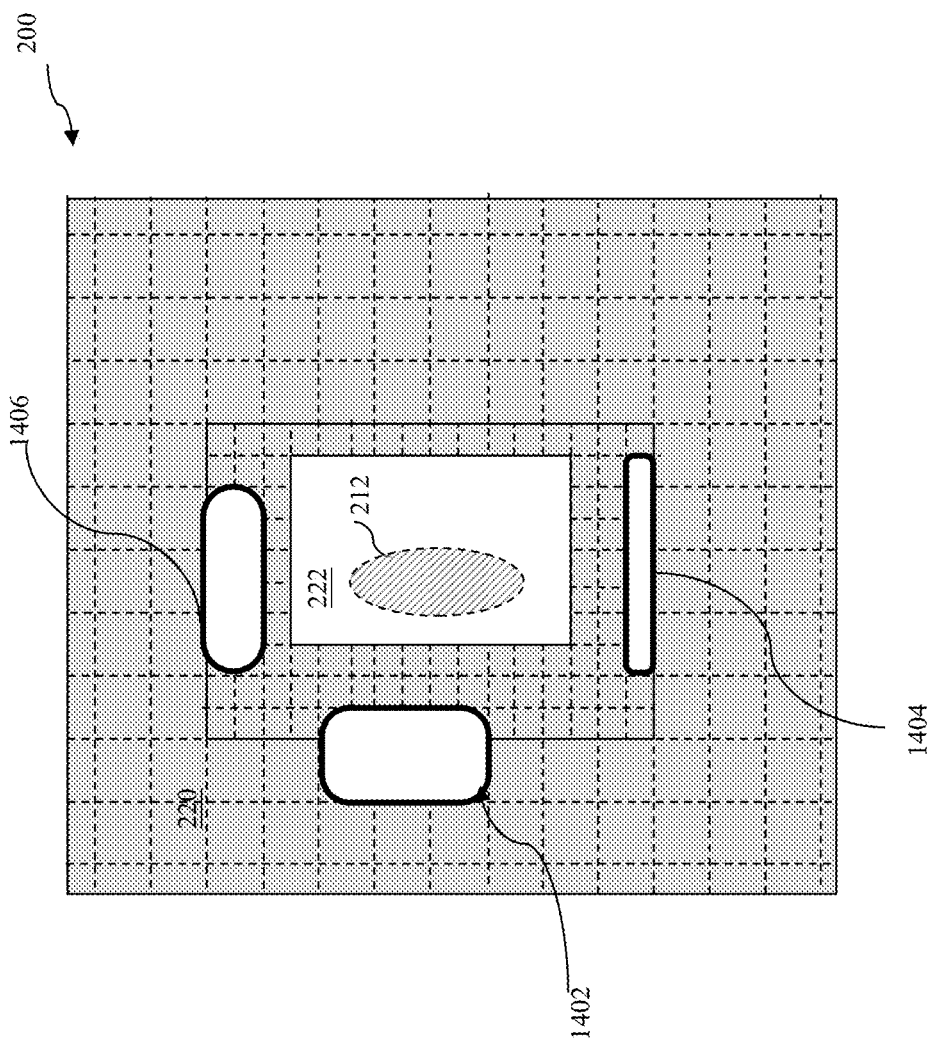

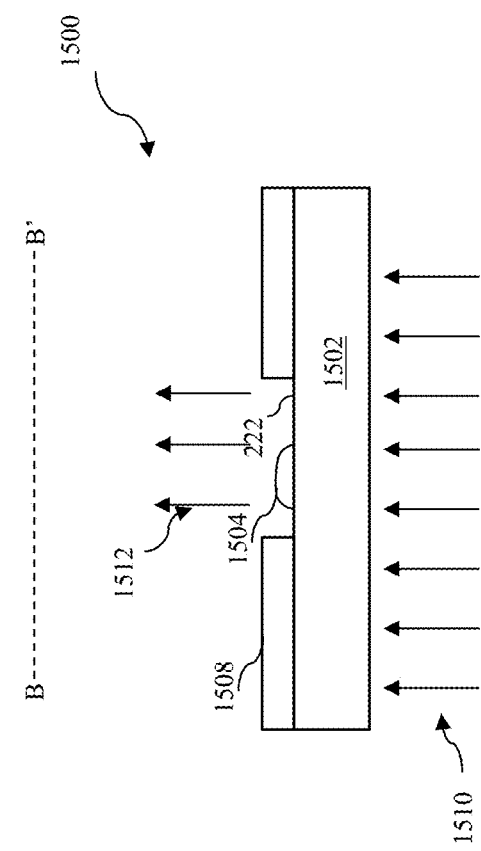
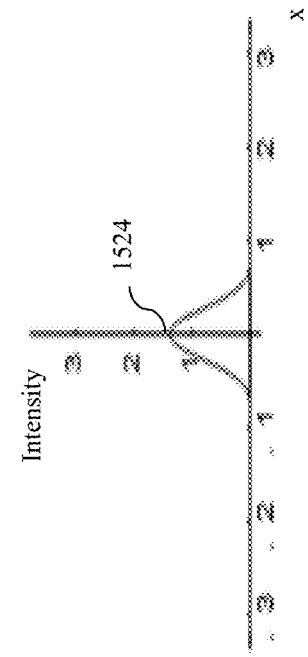
FIG. 15B
FIG. 15A
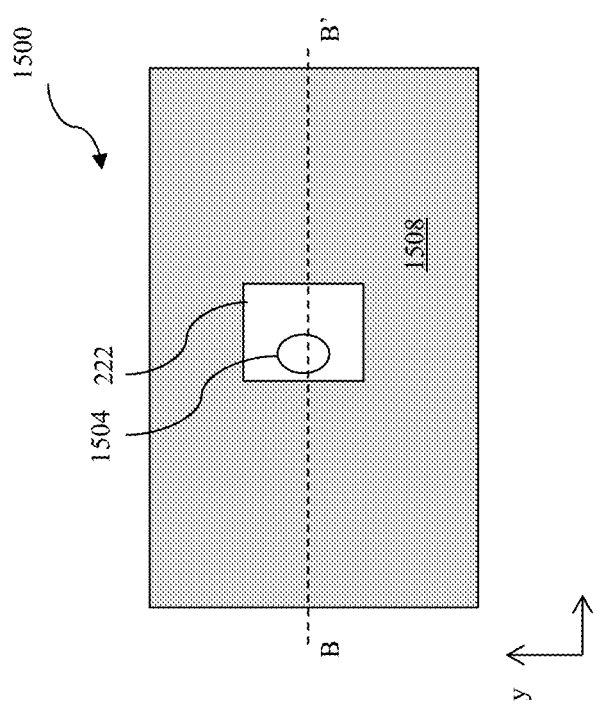
FIG. 15C
FIG. 15D

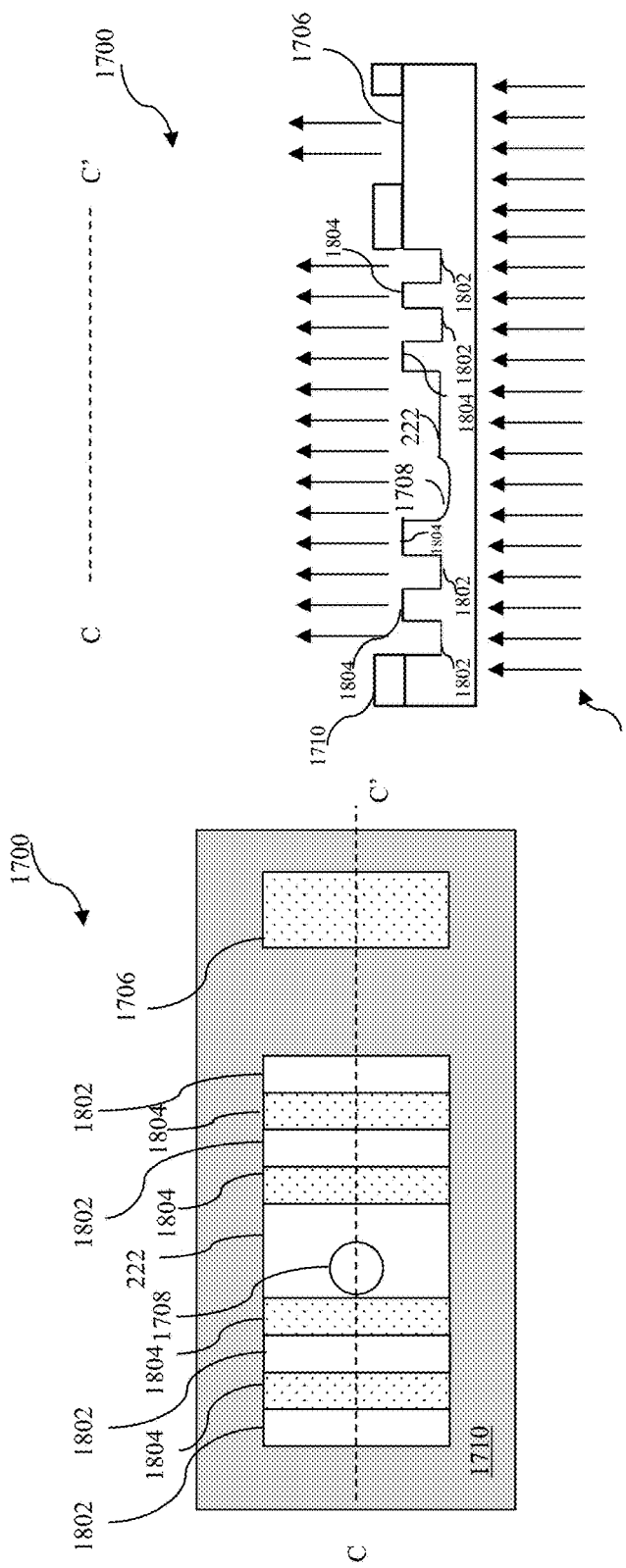
FIG. 18A
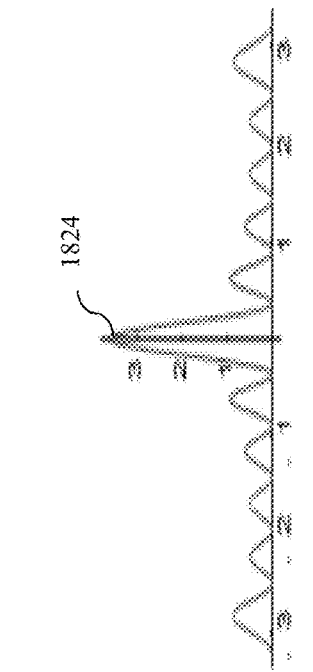
FIG. 18B
FIG. 18C
FIG. 18D

METHOD FOR REPAIRING A MASK

CROSS-REFERENCE TO RELATED APPLICATIONS

This application claims priority to U.S. Provisional Patent Application Ser. No. 62/346,273, entitled "METHOD FOR REPAIRING A MASK" filed on Jun. 6, 2016, the entire disclosure of which is hereby incorporated herein by reference.

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

For example, the need to perform higher resolution lithography processes grows. One lithography technique used to address this need is extreme ultraviolet lithography (EUVL). Masks used in EUVL present new challenges. For example, a multilayer structure is used in an extreme ultraviolet (EUV) mask. A microscopic non-flatness (caused by a defect, for example) on a surface of the substrate of the EUV mask may deform the films of the multilayer structure deposited subsequently thereon, which may affect the quality or integrity of the corresponding exposed image. However, defects below or inside a multiplayer of EUV masks cannot be removed by standard repair techniques.

Therefore, it is desired to provide an improved mask repair method.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIG. 6B illustrates a point spread function of the imaging system of FIG. 6A according to some embodiments. FIG. 6C illustrates a two-dimensional projection of the point spread function according to some embodiments.

FIG. 7A illustrates amplitude distributions of lights transmitted through two point openings of a mask according to a point spread function in an imaging system according to some embodiments. FIG. 7B illustrates amplitude distributions of light transmitted through one of the two point openings of FIG. 7A according to a point spread function in an imaging system according to some embodiments.

FIG. 8A illustrates amplitude distributions of lights transmitted through two point openings of a mask according to a point spread function in an imaging system according to some embodiments. FIG. 8B illustrates amplitude distributions of light transmitted through one of the two point openings of FIG. 8A according to a point spread function in an imaging system according to some embodiments.

FIG. 9A illustrates amplitude distributions of lights transmitted through two point openings of a mask according to a point spread function in an imaging system according to some embodiments. FIG. 9B illustrates amplitude distributions of light transmitted through one of the two point openings of FIG. 9A according to a point spread function in an imaging system according to some embodiments.

FIG. 14 is a diagrammatic top view of a portion of a repaired mask including repair features according to some embodiments.

FIG. 15A is a top view of a portion of a mask according to some embodiments. FIG. 15B is a cross-sectional view of a portion of a mask of FIG. 15A according to some embodiments. FIG. 15C is an amplitude distribution of a defect region of the mask of FIG. 15A according to some embodiments. FIG. 15D is an intensity distribution of the defect region of the mask of FIG. 15A according to some embodiments.

FIG. 18A is a top view of a portion of the mask of FIG. 17A after repair features are formed according to some embodiments. FIG. 18B is a cross-sectional view of a portion of the mask of FIG. 17A according to some embodiments. FIG. 18C is an amplitude distribution of a defect region of the mask of FIG. 18A according to some embodiments. FIG. 18D is an intensity distribution of the defect region of the mask of FIG. 18A according to some embodiments.

DETAILED DESCRIPTION

Figure 1A:
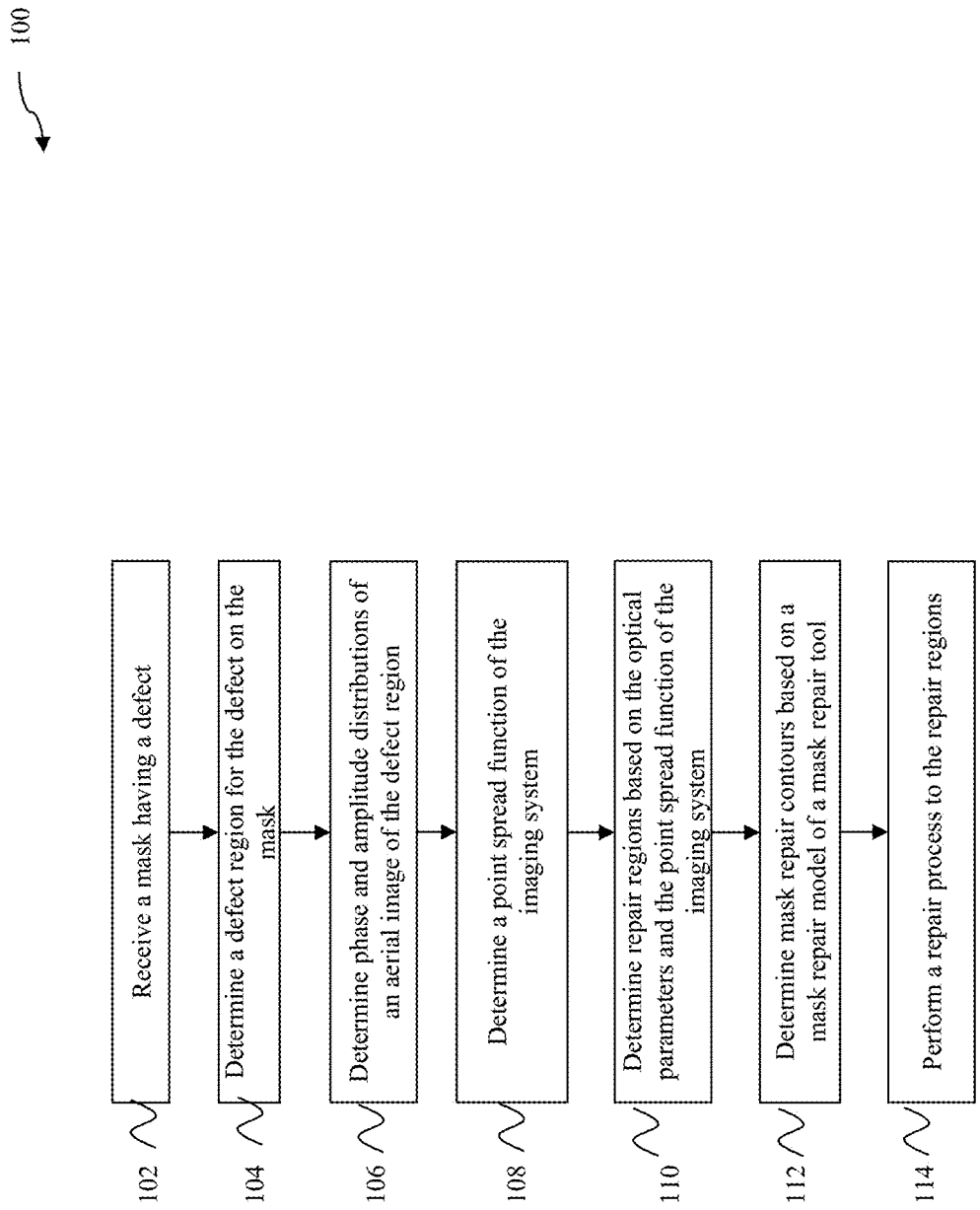
FIGS. 1A, 1B, and 1C are flowcharts of a method for repairing a mask according to one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that embodiments of the present disclosure may benefit various semiconductor manufacturing processes including, but not limited to, integrated circuit (IC) fabrication, mask fabrication, and mask repair.

FIG. 1A is a flowchart of a method 100 of repairing a defect in a mask constructed according to various aspects of the present disclosure in one or more embodiments. The mask repairing may be implemented in a mask shop for making a mask, in a fab for fabricating a semiconductor device on a wafer using a mask, or in a glass factory for manufacturing a mask blanket. It is understood that additional steps can be provided before, during, and after the method 100, and some of the steps described can be replaced, eliminated, or moved around for additional embodiments of the method 100. The method 100 is only an exemplary embodiment, and is not intended to limit the present invention beyond what is explicitly recited in the claims.

The method 100 begins at block 102 by receiving or providing a mask having a defect. The mask is used to fabricate devices and/or circuits on semiconductor wafers during lithography processes. The mask includes a substrate and a pattern formed on or to be formed on the substrate. The pattern is defined according to a circuit design.

Figure 2A:
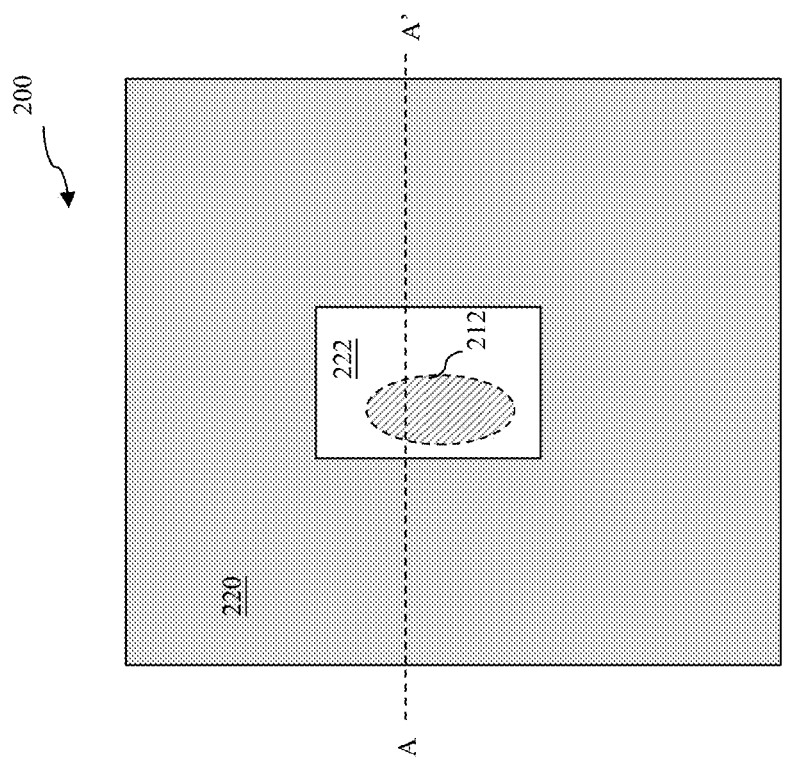
FIG. 2A is a top view of a portion of a photomask (or reticle or mask) according to some embodiments.
Figure 2B:
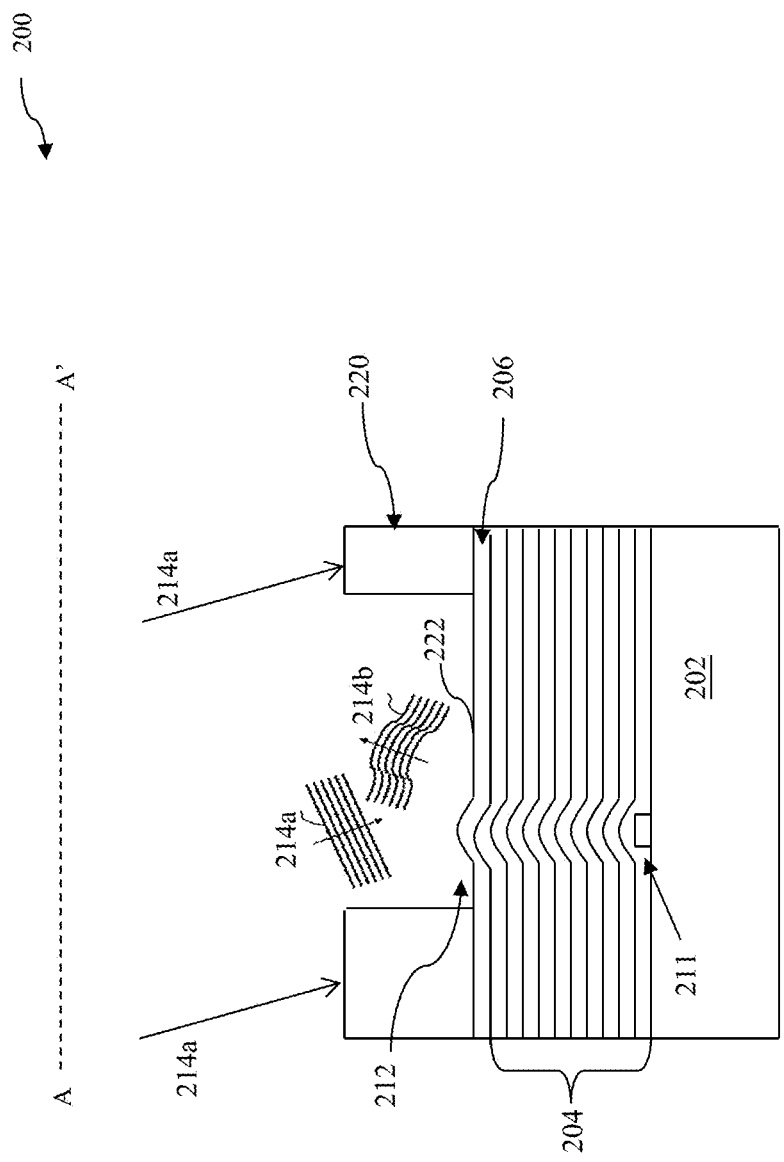
FIG. 2B is a cross-sectional of the mask of FIG. 2A according to some embodiments.

Referring to the examples of FIGS. 2A and 2B, and in an embodiment of block 102, a reflective mask 200 (also referred to as an EUV mask 200) to be used in an EUV lithography system is illustrated. The reflective mask 200 includes a substrate 202, a reflective multilayer (ML) 204 deposited on the substrate 202, a capping layer 206 (also referred to as a buffer layer 206) deposited on the reflective ML 204, and a patterned absorption layer 220 deposited on the capping layer 206. It is understood that other configurations and inclusion or omission of various items in the mask 200 may be possible, without departing from the scope of the present disclosure.

In some embodiments, the substrate 202 may include low thermal expansion material (LTEM). The substrate 202 serves to minimize image distortion due to mask heating by the intensified illumination radiation. The LTEM may include fused silica, fused quartz, calcium fluoride ($CaF_2$), silicon carbide, silicon oxide-titanium oxide alloy and/or other suitable LTEM known in the art. The substrate 202 includes materials with a low defect level and a smooth surface.

The reflective ML 204 is deposited on the substrate 202. According to the Fresnel equations, light reflection occurs when light propagates across the interface between two materials of different refractive indices. The reflected light is greater when the difference of refractive indices is greater. To increase the reflected light, one may also increase the number of interfaces by depositing the reflective ML 204 of alternating materials and let light reflected from different interfaces interfere constructively, by choosing appropriate thicknesses for each layer inside the reflective ML 204. However, the absorption of the materials employed for the reflective ML 204 limits the highest reflectivity that can be achieved. The reflective ML 204 includes a plurality of film pairs, such as molybdenum-silicon (Mo/Si) film pairs (e.g., a layer of molybdenum above or below a layer of silicon in each film pair). Alternatively, the reflective ML 204 may include molybdenum-beryllium (Mo/Be) film pairs, or any material that is highly reflective at EUV wavelengths can be utilized for the reflective ML 204. The thickness of each layer of the reflective ML 204 depends on the EUV wavelength and the incident angle. The thickness of the reflective ML 204 is adjusted to achieve a maximum constructive interference of the EUV light reflected at each interface and a minimum absorption of the EUV light by the reflective ML 204. The reflective ML 204 may be selected such that it provides a high reflectivity to a selected radiation type/wavelength. A typical number of film pairs are 20-80, however any number of film pairs is possible. In some embodiments, the reflective ML 204 includes forty pairs of layers of Mo/Si. In one example, each Mo/Si film pair has a thickness of about 7 nm, with a total thickness of 280 nm, and thereby a reflectivity of about 70% is achieved.

The capping layer 206 is deposited on the reflective ML 204. Because the capping layer 206 has different etching characteristics from an absorption layer, the capping layer 206 acts as an etch stop layer in a subsequent patterning or a repairing process of the absorption layer, which will be described later. The capping layer 206 includes ruthenium (Ru) or Ru compounds such as ruthenium-boron (RuB) or ruthenium-silicon (RuSi).

The absorption layer 220 is deposited on the capping layer 206 and then is patterned to form a main feature 222 (also referred to as a reflective region 222, or a print feature 222) according to an IC design layout. In some embodiments, the absorption layer 220 absorbs a radiation beam projected on it. The absorption layer 220 can include a single layer or multiple layers. The absorption layer 220 may include a absorption material selected from a group of chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), other suitable materials, and a combination thereof.

When an incident EUV radiation is projected onto the EUV mask 200, the patterned absorption layer 220 absorbs the EUV radiation while the ML 204 reflects the EUV radiation, thereby forming a patterned EUV radiation, which may be used to pattern a substrate. As shown in the FIG. 2B, the EUV mask 200 includes absorption areas corresponding to the patterned absorption layer 220. The EUV mask 200 includes a main pattern 222 corresponding to the exposed ML 204.

In some embodiments, defects in a reflective ML may change or distort a reflected beam in its direction, shape, or phase. Therefore, a quality or integrity of a corresponding exposed image (e.g., on a resist-coated substrate) is impacted by the defects located in the reflective ML 204 of the reflective EUV mask 200. In some embodiments, a defect in a reflective ML of a reflective EUV mask affects the phase of the reflected beam, and is also referred to as a phase defect. In the example illustrated in FIG. 2B, an input beam 214a is reflected from the ML 204 to form a reflected beam 214b. A particle 211 located near the lower portion of the ML 204 may cause a phase shift and/or an amplitude change in the reflected beam 214b, and introduce errors in the pattern transferred to a substrate using the EUV mask 200. The areas (e.g., areas of the reflective EUV mask 200) including a deformation, such as caused by the particle 211, may be referred to as a defect region 212. In some examples as illustrated in FIGS. 2A and 2B, the entire defect region 212 is located in and under the reflective region 222. Alternatively, in some examples as illustrated in FIG. 2C, a portion 212a of the defect region 212 is located in and under the reflective region 222, and another portion 212b of the defect region 212 is located in and under the absorption layer 220.

Referring to FIG. 1A, the method 100 proceeds to block 104, wherein the mask is inspected to identify a defect region for the defect using a mask inspection tool, such as an optical inspection tool or an atomic force microscope (AFM). In some embodiments, inspecting the mask includes scanning a surface of the mask, and providing a location, a shape, and/or a size of a defect region on the mask. In some embodiments, at block 104, a surface profile of the defect region is generated. In some embodiments, the inspection is performed after forming the ML 204 on the mask, but before forming the capping layer 206 and depositing and patterning the absorption layer 220 of the mask. In some embodiments, the inspection is performed after forming the capping layer 206, but before depositing and patterning the absorption layer 220 on the mask. In some embodiments, the inspection is performed after depositing and patterning the absorption layer 220 on the mask.

Figure 2C:
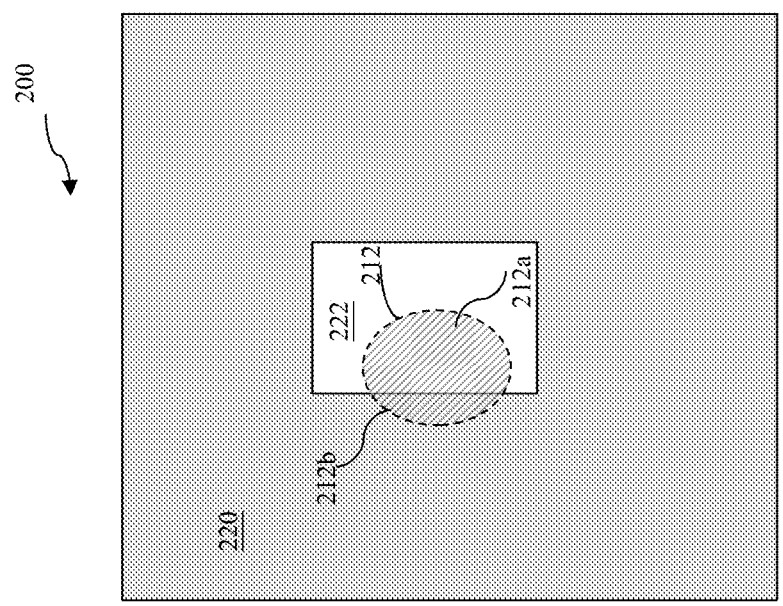
FIG. 2C is a top view of a portion of a photomask (or reticle or mask) according to some embodiments.

Referring to the example of FIG. 2C, in some embodiments the block 104 includes an optional step of removing the absorption layer in the defect region. In the example of FIG. 2C, a defect region 212 includes a portion 212b in the absorption layer 220 of the EUV mask 200. In such examples, a portion of the absorption layer 220 in the area of 212b may be removed (e.g., by a mask repair tool), so that the capping layer 206 is exposed in the entire defect region 212 (including the portions 212a and 212b). Alternatively, in some embodiments, the absorption layer 220 in the area of the defect region portion 212b is not removed, and the capping layer 206 in the area of the defect region portion 212a remains unexposed.

Referring to FIG. 1A, the method 100 proceeds to block 106, where phase and amplitude distributions of an aerial image of the defect region are determined. As discussed above with reference to FIGS. 2A and 2B, the defect in the mask may cause distortions (e.g., to the phase and/or amplitude) to the reflected beam from the defect region, which causes intensity distortion of the aerial image of the defect region and affects the quality or integrity of the corresponding exposed image. Various embodiments of the block 106 may be used to determine phase and amplitude distributions of the aerial image of the defect region, including for example, a method 106A illustrated in FIG. 1B and a method 106B illustrated in FIG. 1C.

Figure 3B:
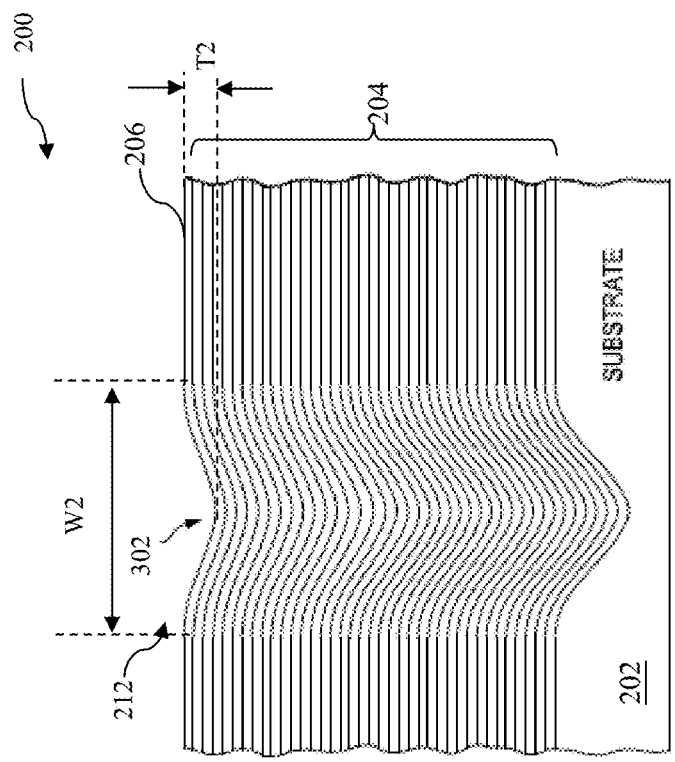
FIGS. 3A and 3B are sectional views of an exemplary defect in a reflective mask according to various embodiments.
Figure 3A:
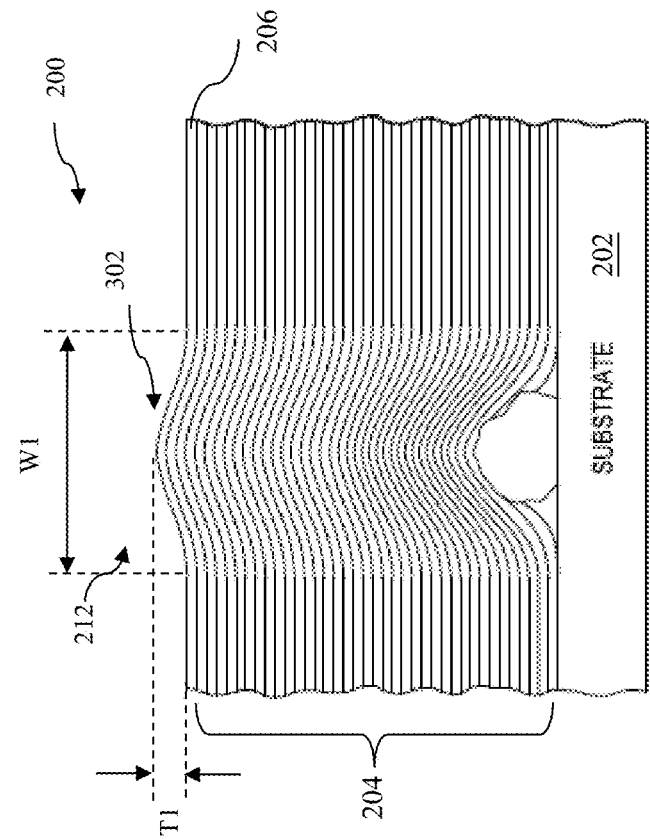

Referring to FIGS. 1B, 3A, 3B, and 4, in some embodiments, at block 106, a method 106A is used to determine the phase and amplitude distributions of an aerial image (e.g., a focal plane aerial image) of the defect region by constructing deformation data of the various layers (e.g., the ML 204, the capping layer 206) of the mask 200. The method 106A starts at block 120, where a surface profile of the defect region 212 is provided. Such a surface profile of the defect region may be generated, for example, by scanning a surface of the mask at and/or near the location of the defect region 212 using a mask inspection tool, such as an optical inspection tool, an atomic force microscope (AFM), and a scanning tunneling microscope (STM). In some examples, the surface profile of the defect region is generated at block 104 using the same process (e.g., an AFM process) to determine the defect region. In some examples, the surface profile of the defect region is generated using an inspection process (e.g., an AFM process) different from the process of block 104 for determining the defect region. Referring to FIG. 3A, in some examples, it is determined that a surface profile 302 of the defect region 212 includes a bump, and has a width W1 and a height T1. Referring to FIG. 3B, in some examples, it is determined that a surface profile 302 of the defect region 212 includes a pit, and the surface profile 304 has a depth T2 and a width W2.

Figures 1B, 1C:
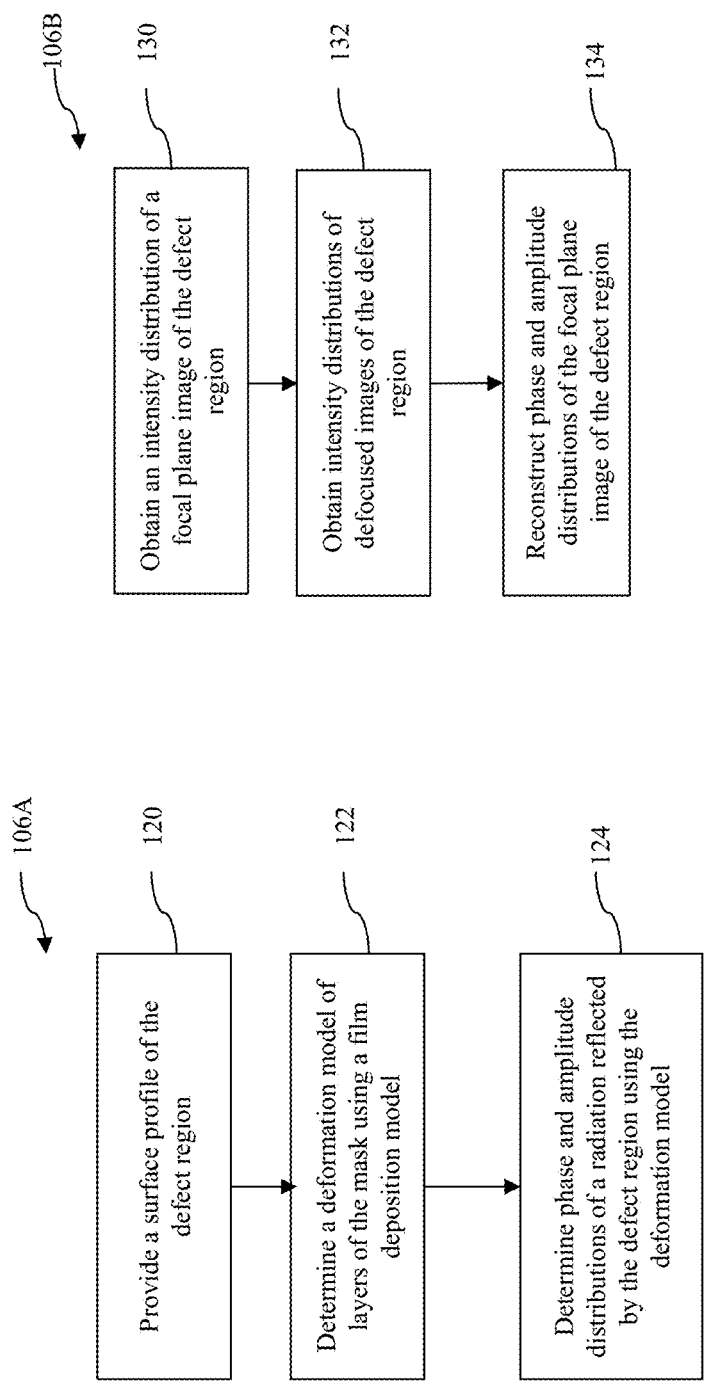
Figure 4:
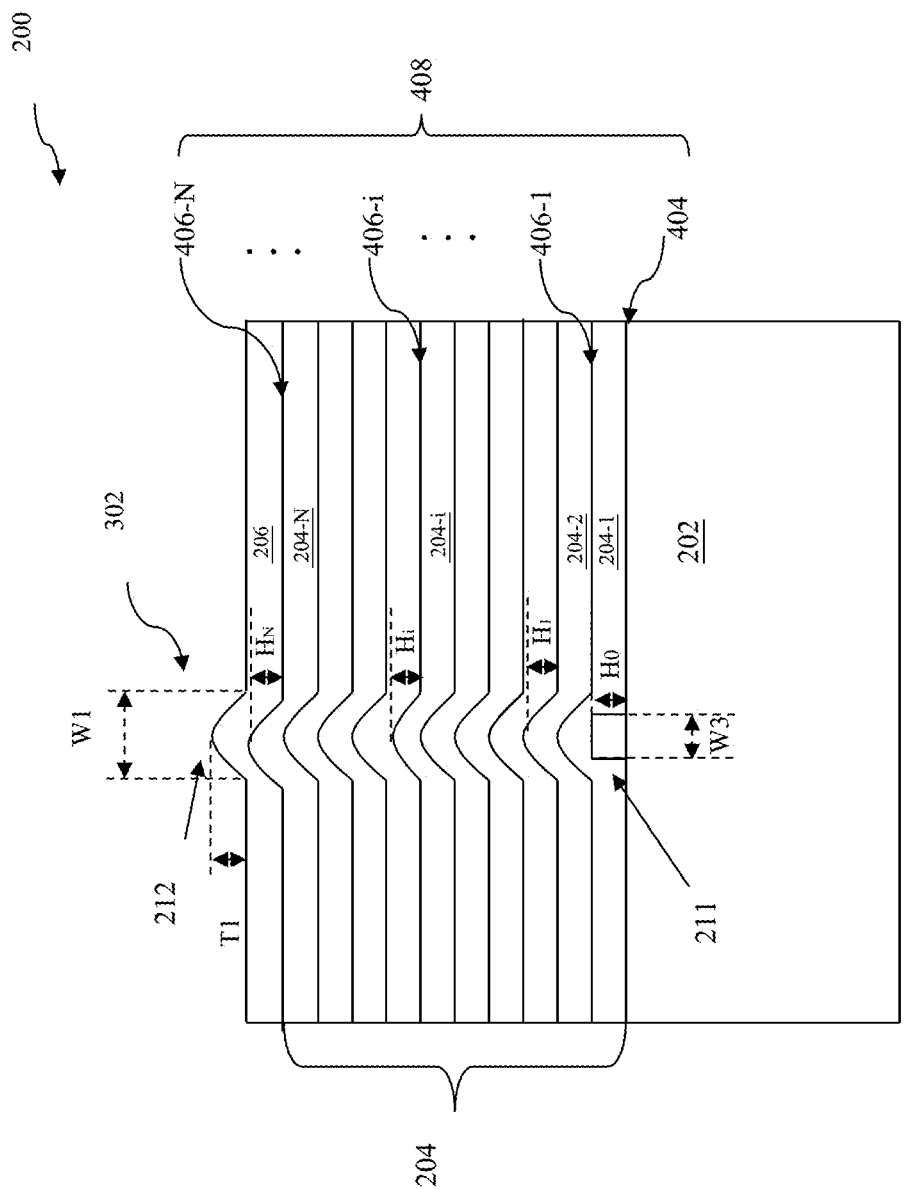
FIG. 4 illustrates a portion of a photomask according to one embodiment.

Referring to FIGS. 1B and 4, the method 106A proceeds to block 122, where deformation data of the layers of the mask is generated based on the surface profile of the defect region 212. In the example of FIG. 4, the defect region 212 of the mask 200 includes a surface profile 302, and deformation data of the layers of the mask 200 is generated based on the surface profile 302. The ML 204 of the mask 200 includes film pairs 204-1, 204-2, . . . , and 204-N, where N is a positive integer (e.g., about 40). In some embodiments, the deformation data 408 includes the substrate surface profile 404 for the substrate 202, and N film pair surface profiles 406-1, 406-2, . . . , 406-i, . . . , and 406-N. Those surface profiles correspond to the interfaces between the film pairs 204-1, 204-2, . . . , and 204-N, and the interface between the film pair 204-N and the capping layer 206. In some embodiments, the deformation data 408 includes heights $H_0$, . . . , $H_1$, . . . , and $H_N$. The height $H_0$ is a height of the particle 211, and the heights $H_1$, $H_i$, . . . , and $H_N$ are the difference between the film pair surface profiles 406-1, . . . , 406-N and horizontal planes the film pairs 204-1, 204-2, . . . , and 204-N. In some embodiments, the deformation data 408 uniquely characterizes the structure of layers under the defect region 212.

In various embodiments, the deformation data 408 may be generated using computer simulations based on deposition models and etch models for a sequence of deposition and etch steps used to form the mask 200. The deposition models and etch models include deposition and etch parameters including for example, the growth parameters (e.g., the number of the film pairs, the thickness of each of the film pairs) of the deposition steps (e.g., the deposition steps forming each of the film pair and the capping layer) and the etch parameters (e.g., the etch rate) of the etch steps (e.g., the etch steps used to remove the absorption layer in the reflective regions 222).

Referring to FIG. 1B, the block 106 then proceeds to block 124, where phase and/or amplitude distributions of an aerial image of the defect region are determined. In some examples, simulations of light diffraction based on the deformation data of the layers of the mask 200 are performed to determine the phase and/or amplitude distributions of an aerial image of the defect region. The simulations may also be performed using optical conditions (e.g., a wavelength of a radiation source, a numerical aperture) of an imaging system where the mask 200 is used to transfer its pattern to a target substrate.

Figure 5A:
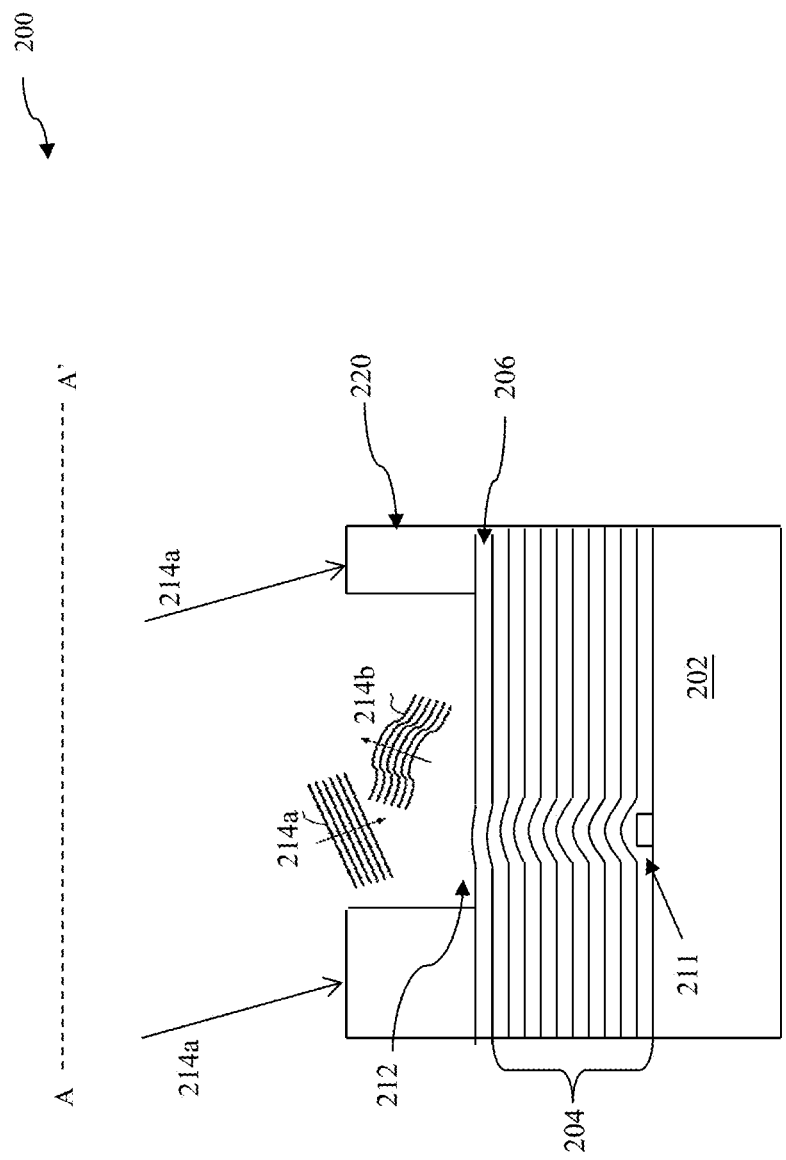
FIG. 5A illustrates a portion of a photomask according to one embodiment.
Figure 5B:
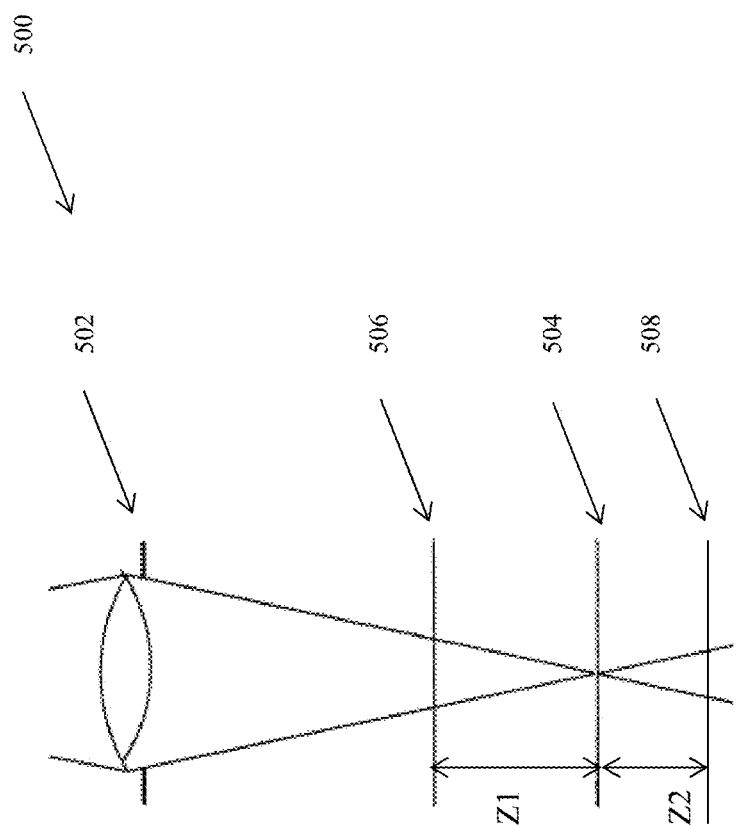
FIG. 5B illustrates an imaging system according to some embodiments.

Referring to FIGS. 1C, 5A, and 5B, alternatively, in some embodiments, a method 106B is used to at block 106 to determine phase and/or amplitude distributions of an aerial image (e.g., a focal plane aerial image) of the defect region using through-focus intensity distributions of the defect region. In some examples, the method 106B does not depend on a surface profile of the defect region 212. As illustrated in the example of FIG. 5A, in some embodiments, film pairs of the ML 204 closer to a top surface of the ML 204 may have less deformation than film pairs of the ML 204 further away from the top surface of the ML 204. In such embodiments, it may be challenging to generate deformation data of the layers of the mask based on the surface profile of the defect region 212, where the defect region 212 of FIG. 5A has a flatter surface profile compared to the surface profile shown in FIG. 4. Because the method 106B does not depend on a surface profile of the defect region 212, the method 106B may be used for both the defect region 212 of FIG. 5A and the defect region 212 of FIG. 4

The method 106B begins at block 130, where a focal plane intensity distribution of an aerial image of a defect region 212 is obtained. Referring to FIG. 5B illustrated is an example of a simplified schematic view of an imaging system 500. The imaging system 500 may be used to transfer the pattern on the mask 200 to a target (e.g., a wafer). The imaging system 500 has a pupil plane 502 and a focal plane 504. A focal plane intensity distribution of an aerial image of a defect region 212 at the focal plane 504 may be obtained, for example, by using an actinic inspection tool or a microlithography simulation microscope configured according to the optics conditions (e.g., wavelength, numeric aperture, image plane location) of the imaging system 500.

The method 106B then proceeds to block 132, where one or more defocused plane intensity distributions of aerial images of the defect region at defocused planes are obtained. Referring to the example of FIG. 5B, a defocused plane 506 is located between the pupil plane 502 and the focal plane 504, and has a distance Z1 (e.g., between about 40 μm to about 50 μm) from the focal plane 504. A first defocused plane intensity distribution of an aerial image of the defect region 212 at the defocused plane 506 is measured. Similarly, a defocused plane 508 is disposed at a distance Z2 (e.g., between about 20 μm and about 25 μm) from the focal plane 504 and a second defocused plane intensity distribution of an aerial image of the defect region at the defocused plane 508 is obtained. The intensity distributions may be obtained by using an actinic inspection tool or a microlithography simulation microscope configured according to the optics conditions (e.g., wavelength, numeric aperture, image plane locations) of the imaging system 500.

The method 106B then proceeds to block 134, where phase and amplitude distributions of the focal plane image of the defect region are reconstructed using the focal plane intensity distribution and the defocused plane intensity distributions of the defect region. Various algorithms, for example, such as a modified Gerchberg-Saxton algorithm, may be used for the reconstruction.

Figure 6A:
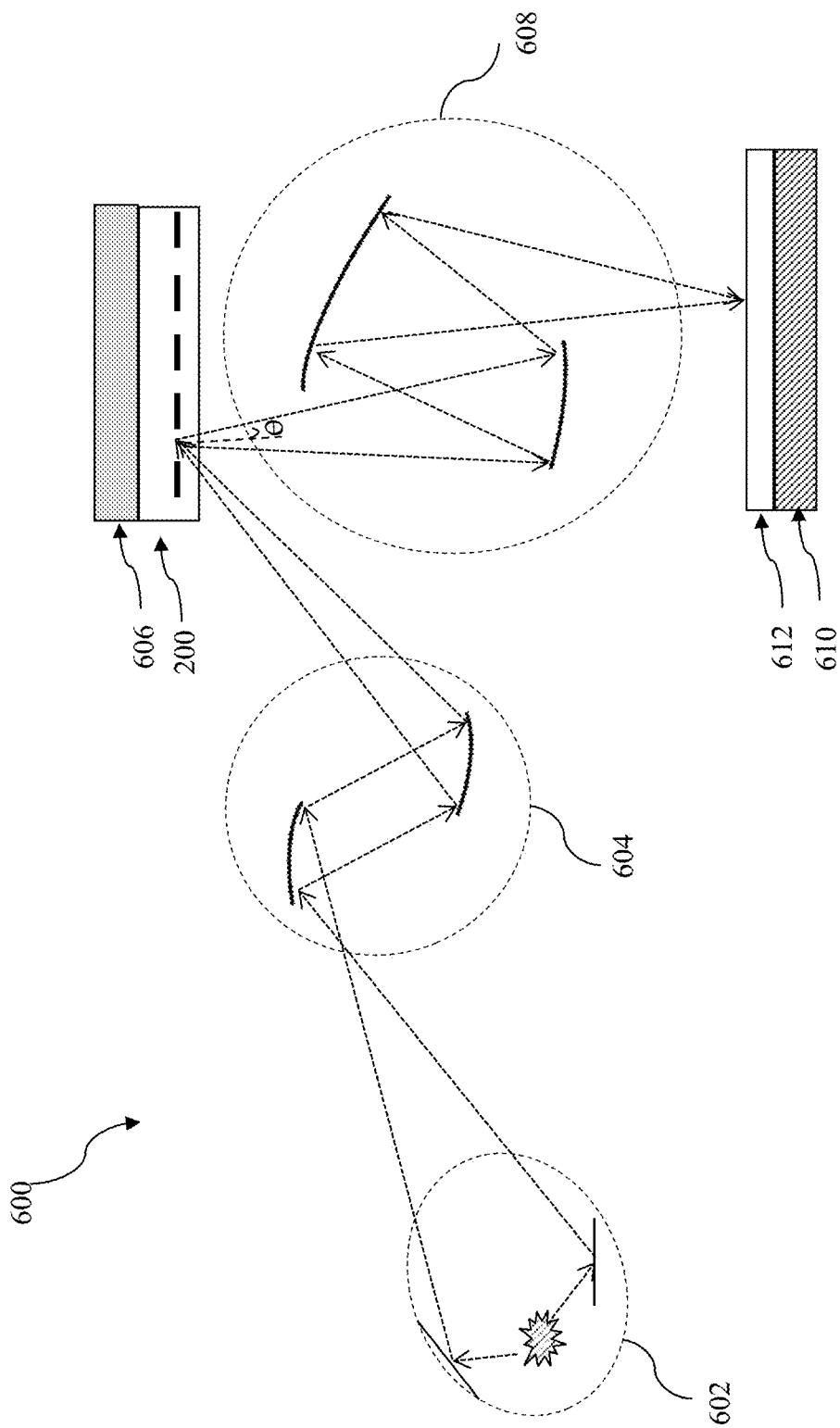
FIG. 6A illustrates an imaging system according to some embodiments.

Referring to FIGS. 1A, 6A, 6B, and 6C, the method 100 then proceeds to block 108, where optics parameters of an imaging system are received to determine a point spread function of the imaging system. In various embodiments, the point spread function of the imaging system may be determined based on the type of the imaging system. In some embodiments, the imaging system is a coherent imaging system, and its radiation source is a point source with an infinitely small dimension. The complex amplitude (including phase and amplitude) of the optical field on a wafer of such coherent imaging system is the convolution of a point spread function of the coherent imaging system with a corresponding mask pattern. The point spread function of the coherent imaging system may be the optical field distribution on the wafer for a point opening on a mask used in the coherent imaging system. The intensity of the optical field on the wafer in such coherent imaging system is the square of the modulus of the complex amplitude of the optical filed. In some embodiments, the imaging system is a partially coherent imaging system, and its radiation source is an extended source. The complex amplitude of the optical field on a wafer of such partially coherent imaging system may not be easily defined. To calculate the intensity of the optical field on the wafer, singular value decomposition for the transmission cross coefficient of such partially inherent imaging system may be performed to obtain eigenfunctions and corresponding eigenvalues. The intensity of the optical field on the wafer in such partially coherent imaging system is the sum of the square of the modulus of the convolution of respective eigenfunctions with the mask pattern, weighted by the corresponding eigenvalue. In such embodiments, the eigenfunction with the largest eigenvalue may be used as the point spread function in the mask repair process discussed below, and may be referred to as the point spread function of the partially coherent imaging system Referring to the example of FIG. 6A, illustrated therein is an imaging system 600. The imaging system 600 may be the same imaging system 500 as discussed above with reference to FIG. 5B. In some embodiments, the imaging system 600 may include an EUV imaging system. The imaging system 600 may receive a mask 200 and a substrate 612, perform a lithography process to the substrate 612 using the mask 200, and generate an imaged substrate. The imaging system 600 includes a plurality of subsystems such as a radiation source 602, an illuminator 604, a mask stage 606 configured to receive a mask 200, projection optics 608, and a substrate stage 610 configured to receive a semiconductor substrate 612. The imaging system 600 exposes a photosensitive material (e.g., a photoresist layer) coated on the semiconductor substrate 612, such as a silicon wafer. The IC design pattern defined on the mask 200 is imaged to the photoresist layer to form a latent pattern. The semiconductor substrate 612 may be any suitable elementary semiconductor, compound semiconductor, or alloy semiconductor. In some embodiments, the exposed substrate 612 is processed using additional steps such as development and baking to create a pattern on the substrate. For example, the patterning of the photoresist layer may further include developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

In some embodiments, the imaging system 600 has a numerical aperture which measures the size of a cone of light that the projection optics 608 can collect. In an example, the numerical aperture is proportional to sin(θ), where θ is the maximum collection half-angle of the projection optics 608.

Referring to the example of FIG. 6B, a point spread function (PSF) 620 of the imaging system 600 is determined using the optical parameters (e.g., the numerical aperture) of the imaging system 600. The PSF 620 describes the response of the imaging system 600 to a point source or point object. The PSF of the imaging system 600 may be affected by the wavelength of the radiation source 602 and optical parameters (e.g., a numerical aperture) of the imaging system 600. In the example illustrated in FIG. 6B, the PSF 620 includes a main lobe 622, and its width W3 is proportional to the wavelength and inversely proportional to the numerical aperture. The PSF 620 includes side lobes 626 and 630 having positive amplitudes, and side lobes 624, 628, and 632 have negative amplitudes. In some embodiments, the absolute values of the peak amplitudes of side lobes further from the main lobe 622 are less than those of side lobes closer to the main lobe 622.

The oscillations of the PSF 620 are also illustrated in FIG. 6C, which illustrates the main lobe and the side lobes in an image plane, and which corresponds to the PSF 620 of FIG. 6B. In the example of FIG. 6C, the main lobe and side lobes of the PSF 620 are represented by concentric rings having a center 634, and are also referred as rings of the PSF 620. Rings 626 and 630 have positive amplitudes, and are also referred to as positive rings 626 and 630. Rings 624, 628, and 632 have negative amplitudes, and are also referred to as negative rings 624, 628, and 632. Each ring has a width. For example, the ring 624 has a width equal to the distance between x1 and x2, the ring 626 has a width equal to the distance between x2 and x3, the ring 628 has a width equal to the distance between x3 and x4, the ring 630 has a width equal to the distance between x4 and x5, and the ring 632 has a width equal to a distance between x5 and x6.

Referring to FIGS. 1A, 7A, 7B, 8A, 8B, 9A, 9B, 10, 11, and 12, the method 100 proceeds to block 110, where repair regions are determined based on the point spread function of the imaging system. In the examples of FIGS. 7A, 7B, 8A, 8B, 9A, and 9B, point openings in a transmission mask are used to illustrate how a repair region point opening in a repair region at various locations affects the aerial image intensity of an aerial image of a defect region point opening in a defect region in the mask. For clarity of discussion, the point openings have an infinitely small dimension so that the amplitude distribution of an aerial image of a point opening is substantially the same as the point spread function of the imaging system.

It is noted that while a transmission mask is used in those figures as an example, it is not intended to be limiting. In some embodiments, point spread functions of reflecting points in a reflective mask may be substantially similar to those point spread functions described with reference to FIGS. 7A, 7B, 8A, 8B, 9A, and 9B. Moreover, as described in detail below with reference to FIGS. 10, 11, and 12, in some embodiments, for a repaired main feature of a mask, the aerial image is the combined contributions of the entire area of the repaired main feature (including the original main feature, defect region and the repair regions). In such embodiments, the intensity of a particular point in the image plane is computed by integrating (e.g., using a convolution operation) the contributions from the point spread functions of the points of the entire area of the repaired main feature.

Referring to the examples of FIGS. 7A and 7B, a mask 700 has a defect region point opening 702. The defect region point opening 702 is located in a defect region of the mask, and is also referred to as a defect region point opening 702. An amplitude distribution 620-1 illustrates the amplitude distribution of an aerial image of the defect region point opening 702 at a focal plane of an imaging system. The amplitude distribution 620-1 may be substantially similar to the point spread function 620 of FIG. 6A. As shown in the amplitude distribution 620-1, at the location 708, the aerial image of the defect region point opening 702 has a phase that is substantially equal to zero (e.g., having a phase that is the same as an aerial image of a point opening that is not phase shifted by a defect), and an amplitude A1 that has a positive value.

In some embodiments, it is determined that the image intensity at the location 708 need to be increased (e.g., to compensate for the image intensity loss caused by a defect). In such embodiments, a point opening 704 is added to the mask 700. The point opening 704 is located in a repair region of the mask, and is also referred to as a repair region point opening 704. A distance D1 between the defect region point opening 702 and the repair region point opening 704 is chosen so that the image intensity at the location 708 is increased by the repair region point opening 704. The amplitude distribution 620-2 illustrates an amplitude distribution of an aerial image of the repair region point opening 704 at a focal plane of the imaging system, and may be substantially similar to the point spread function 620 of FIG. 6A. As illustrated in FIG. 7B, the amplitude distribution 620-2 includes positive rings 622, 626, and 630, where the amplitude of the aerial image of the point opening 704 is positive. The amplitude distribution 620-2 also includes negative rings 624, 628, and 632, where the amplitude of the aerial image of the point opening 704 is negative.

In some embodiments, to increase the image intensity at the location 708, the distance D1 is chosen based on the widths of the main lobe and side lobes of the point spread function so that the location 708 is located in one of the positive rings 622, 626, and 630 of the amplitude distribution 620-2. In a particular example, the distance D1 is proportionate to a distance D2 of the location 708 to the center 634 of the amplitude distribution 620-2, and the location 708 falls in the positive ring 626 of the amplitude distribution 620-2. In that particular example, the amplitude at the location 708 is the combined amplitude of the amplitude A1 of the amplitude distribution 620-1 and the amplitude A2 of the amplitude distribution 620-2. Because both amplitudes A1 and A2 have positive values, an absolute value of the combined amplitude is greater than the absolute value of the amplitude A1. As such, the image intensity of the location 708 is increased by the repair region point opening 704.

Referring to FIGS. 8A and 8B, in some embodiments, it is determined that the image intensity of the aerial image of the defect region point opening 702 at the location 708 need to be reduced. In such embodiments, a repair region point opening 704 is added to the mask 700, where a distance D3 between the defect region point opening 702 and the repair region point opening 704 is chosen so that the image intensity at the location 708 is reduced. The amplitude distribution 620-3 illustrates an amplitude distribution of an aerial image of the repair region point opening 704 at a focal plane of the imaging system, and may be substantially similar to the point spread function 620 of FIG. 6A. As illustrated in FIG. 8B, the amplitude distribution 620-3 includes positive rings 622, 626, and 630, where the amplitude of the aerial image of the repair region point opening 704 is positive. The amplitude distribution 620-3 also includes negative rings 624, 628, and 632, where the amplitude of the aerial image of the repair region point opening 704 is negative.

In some embodiments, to reduce the image intensity at the location 708, the distance D3 is chosen based on the widths of the main lobe and side lobes of the point spread function so that the location 708 is located in one of the negative rings 624, 628, and 632 of the amplitude distribution 620-3. In a particular example, the distance D3 is proportionate to a distance D4 of the location 708 to the center 634 of the amplitude distribution 620-3, and the location 708 falls in the negative ring 624 of the amplitude distribution 620-3. In that particular example, the amplitude at the location 708 is the combined amplitude of the amplitude A1 of the amplitude distribution 620-1 and the amplitude A3 of the amplitude distribution 620-3. Because the amplitude A1 has a positive value and the amplitude A3 has a negative value, an absolute value of the combined amplitude is less than the absolute value of the amplitude A1. As such, the image intensity of the location 708 is reduced by the repair region point opening 704.

Referring to FIGS. 9A and 9B, in some embodiments, at the location 708, the aerial image of the defect region point opening 702 has a phase that is substantially equal to 180 degrees (e.g., a radiation from the defect region point opening 702 is phase-shifted by about 180 degrees due to a defect), and an amplitude A1 that has a negative value. In such embodiments, to increase the image intensity at the location 708, a repair region point opening 704 is added to the mask 700, where a distance D5 between the defect region point opening 702 and the repair region point opening 704 is chosen so that the image intensity at the location 708 is increased. In some embodiments, the amplitude distribution 620-4 illustrates an amplitude distribution of an aerial image of the repair region point opening 704 at a focal plane of the imaging system, and may be substantially similar to the point spread function 620 of FIG. 6A. As illustrated in FIG. 9B, the amplitude distribution 620-4 includes positive rings 622, 626, and 630, where the amplitude of the aerial image of the repair region point opening 704 is positive. The amplitude distribution 620-4 also includes negative rings 624, 628, and 632, where the amplitude of the aerial image of the repair region point opening 704 is negative.

In some embodiments, to increase the image intensity at the location 708, the distance D5 is chosen based on the widths of the main lobe and side lobes of the point spread function so that the location 708 is located in one of the negative rings 624, 628, and 632 of the amplitude distribution 620-4. In a particular example, the distance D5 is proportionate to a distance D6 of the location 708 to the center 634 of the amplitude distribution 620-4, and the location 708 falls in the negative ring 624 of the amplitude distribution 620-4. In that particular example, the amplitude at the location 708 is the combined amplitude of the amplitude A1 of the amplitude distribution 620-1 and the amplitude A4 of the amplitude distribution 620-4. Because both amplitudes A1 and A2 have negative values, an absolute value of the combined amplitude is greater than the absolute value of the amplitude A1. As such, the image intensity of the location 708 is increased by the repair region point opening 704.

In some embodiments where at the location 708, the aerial image of the defect region point opening 702 of a mask 700 has a phase that is substantially equal to 180 degrees and has an amplitude A1 with a negative value, a repair region point opening 704 is added to the mask 700 to reduce the image intensity at the location 708. In such embodiments, a distance between the defect region point opening 702 and the repair region point opening 704 is chosen such that the location 708 is located in one of the positive rings 622, 626, 630 of an amplitude distribution of the repair region point opening 704. In that particular example, the amplitude at the location 708 is the combined amplitude of the amplitude A1 of the amplitude distribution 620-1 and a positive amplitude of the aerial image of the repair region point opening 704. Because the amplitude A1 has a negative value, an absolute value of the combined amplitude is less than the absolute value of the amplitude A1. As such, the image intensity of the location 708 is reduced by the repair region point opening 704.

Figure 10:
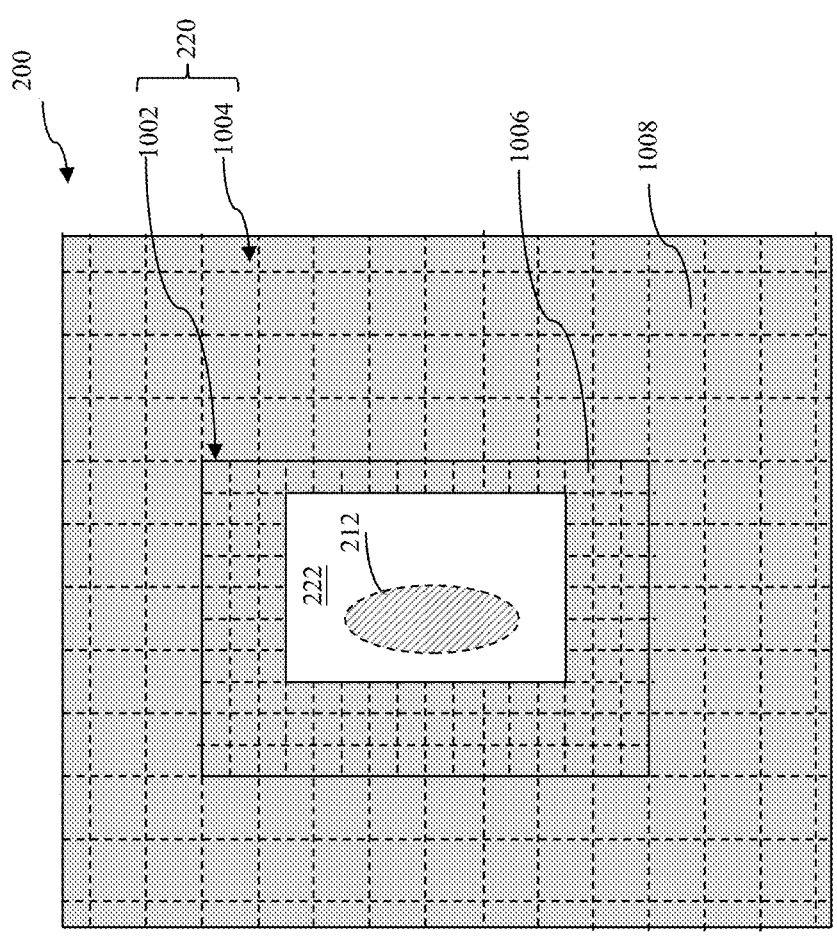
FIG. 10 is a diagrammatic top view of a portion of a mask represented by pixels according to some embodiments.
Figure 11:
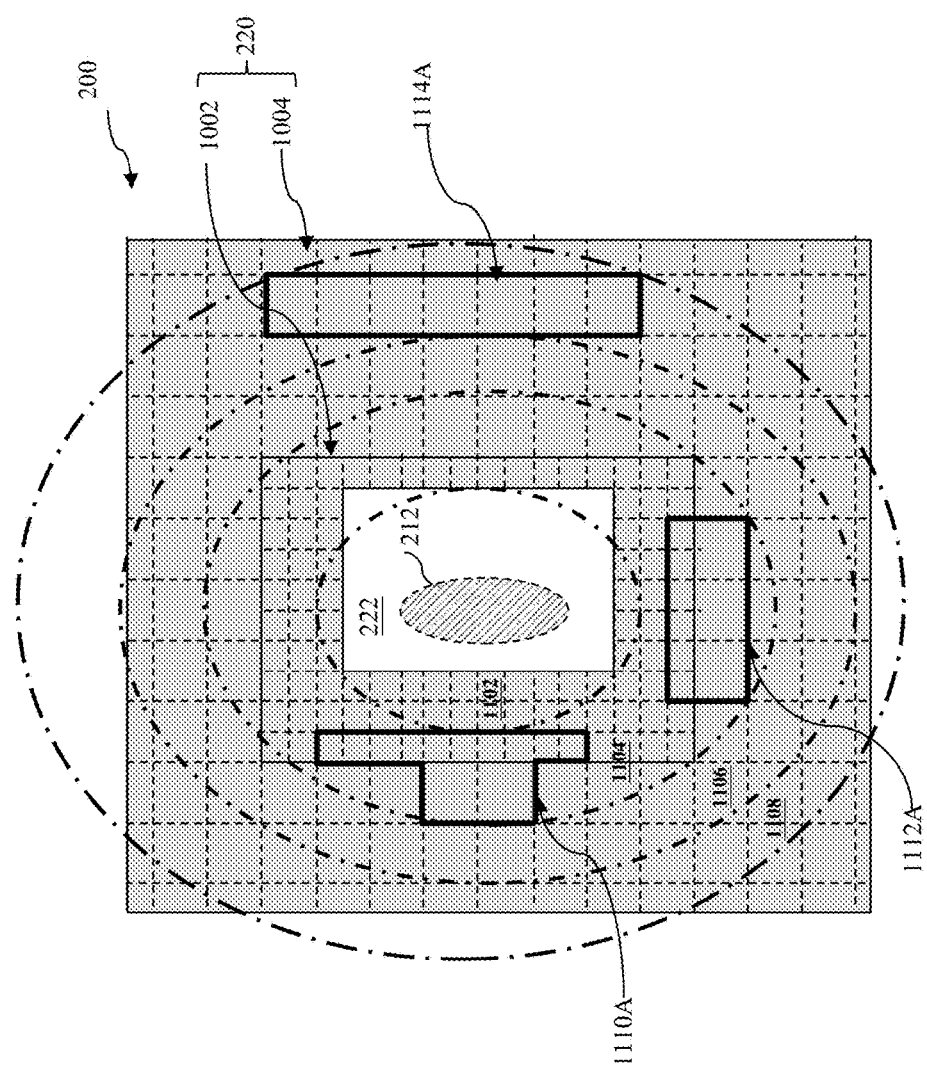
FIG. 11 is a diagrammatic top view of a portion of a mask where initial repair regions are identified according to some embodiments.
Figure 12:
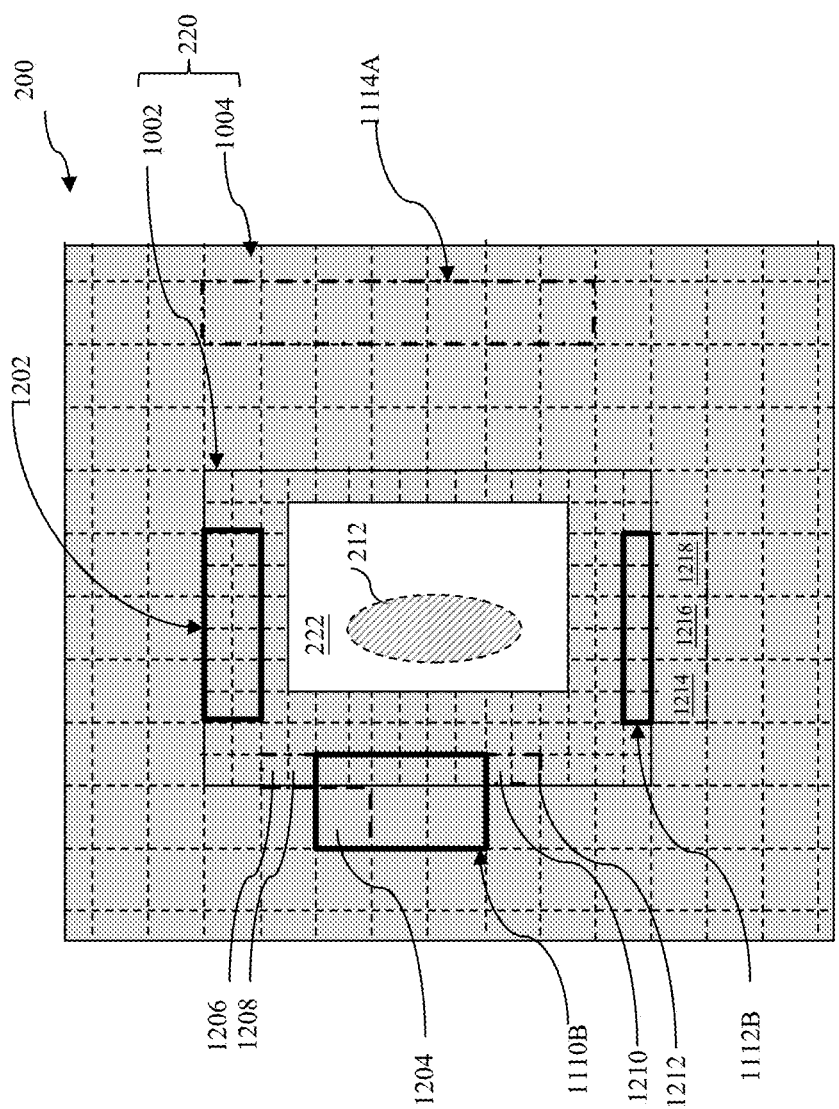
FIG. 12 is a diagrammatic top view of a portion of a mask including repair regions according to some embodiments.

Referring to the example of FIGS. 10, 11, and 12, repair regions in the mask are determined using the point spread function of the imaging system. In some embodiments, the repair regions are determined by a feedback loop involving aerial image or resist image metrology (by AIMS for a mask or scanning electron microscope (SEM) for a wafer) and mask repair. In some embodiments, a simulation may be employed to determine the repair regions in the mask using various simulation models.

Referring to FIG. 10, in some embodiments, the simulation models include a pixel-based compensation recipe. In such embodiments, the mask is divided into multiple areas, and each area is referred to as a mask pixel or a pixel. The status (e.g., whether a particular pixel is included in the repair regions) of the pixels are then iteratively modified until a simulated print image on the wafer matches the desired pattern.

In various embodiments, the sizes of the pixels are determined based on a mask repair model of a mask repair tool. In some examples, the pixel size is equal to or greater than a minimum repair feature size that a mask repair tool is capable of producing. In some embodiments, the pixel sizes relate to effectiveness and efficiency of the simulation for determining the repair regions. In some examples, if the pixel size is too small (less than the minimum repair feature size), it is beyond the capability of the mask repair tool and costs more simulation time without any real improvement in mask repair region optimization. On the other hand, coarse mask pixels may not be capable of taking full advantage of the mask tool, and may not approach the optimal mask repair regions because of the intrinsically poorer resolution induced by large pixel sizes.

In some examples, the mask pixels have a common pixel size. Alternatively, as illustrated in FIG. 10, in some embodiments, the mask pixels have different sizes to improve the effectiveness and efficiency of the simulation. In the example of FIG. 10, the absorption layer 220 includes an inner absorption portion 1002 surrounding the defect region 212, and an outer absorption portion 1004 surrounding the inner portion 1002, where pixels in the inner absorption portion 1002 and outer absorption portion 1004 have different sizes and/or shapes. In some embodiments, the sizes and shapes of the inner absorption portion 1002 and an outer absorption portion 1004 may be determined based on the defect region 212 and the point spread function 620. In some examples, each pixel 1006 in the inner absorption portion 1002 has a first pixel size that is less than a second pixel size of each pixel 1008 of the outer absorption portion 1004. In a particular example, the first pixel size is about one fourth of the second pixel size. In other words, a pixel may be defined to have a smaller pixel size if it is closer to the defect region 212 (e.g., located in the inner absorption portion 1002), and have a larger pixel size if it is further away from the defect region 212 (e.g., located the outer absorption portion 1004). Such process may be used to generate a pixel matrix having variable pixel sizes so that the absorption portion 1002 closer to the defect region 212 has a finer pixel resolution than the absorption portion 1004 that is further away from the defect region 212, which provides for more efficient design and effective optimization of repair regions.

It is noted that while in the example of FIG. 10, the pixels have a rectangular shape, it is understood that the pixels may be defined in various shapes including squares, circles, ovals, pentagons, hexagons, and any other suitable shapes.

In some embodiments, a simulation is implemented to determine the repair regions. The simulation iteratively repeats a process of modifying the repair regions (e.g., by adding pixels to the repair regions or removing pixels from the repair regions), performing a simulation step to determine if the new repair regions are better (e.g., for achieving better wafer patterns and/or satisfying an aerial image intensity range), and then further modifying the repair regions based on the result of the simulation step. The simulation may be applied using a rule-based approach and/or a model-based approach. For a rule-based approach, the repair regions (e.g., locations, sizes, shapes) are set by a list of compensation rules depending on, for example, the defect region, the main feature, and/or the optical parameters and point spread function of the imaging system. For a model-based approach, the printed image on the wafer is simulated using a pattern transfer model of a pattern transfer process (e.g., including an imaging model of an imaging process, and/or a developing model of a developing process), and the repair regions are determined such that the simulated image satisfies the image intensity requirement and/or matches the desired wafer image of the main feature.

Referring to FIGS. 11 and 12, in some examples, a combination of the rule-based approach and the model-based approach (also referred to as a hybrid approach) is used in the simulation. A rule-based approach may be used to provide initial repair regions for the simulation. By using the compensation rules to generate initial repair regions for the simulation, the number of iterations for the simulation may be reduced. Such initial repair regions may be further modified using a model-based approach to optimize the repair regions to achieve the desired pattern on the wafer.

Referring to the example of FIG. 11, initial repair regions for the simulation are determined using a rule-based approach. In some examples, a set of compensation rules are provided to determine locations, sizes, and shapes of the initial repair features according to the defect region 212, the phase and amplitude distributions of the aerial image of the defect region 212, and the point spread function and its oscillatory nature of the imaging system as described above with reference to FIGS. 6A, 6B, 6C, 7A, 7B, 8A, 8B, 9A, and 9B. For example, the compensation rules may be determined based on the distances between a defect region point opening 702 and a repair region point opening 704 (e.g., distances D1, D3, and D5) as described above with reference to FIGS. 7A, 7B, 8A, 8B, 9A, and 9B. In some embodiments, as illustrated in the example of FIG. 11, the phase of a focal plane aerial image the defect region 212 is about 180 degrees. In such embodiments, a set of compensation rules are determined based on the distance D5 as described above with reference to FIGS. 9A and 9B. For example, according to the compensation rules, it is determined that repair regions located in the areas 1102 and 1106 may be used to decrease the image intensity of the image of the defect region 212, where areas 1102 and 1106 are determined based on the widths of area 622 and the ring 626 of the point spread function 620. For further example, according to the compensation rules, it is determined that repair regions located in the areas 1104 and 1108 may be used to increase the image intensity of the image of the defect region 212, where areas 1104 and 1108 are determined based on the widths of the rings 624 and 628 of the point spread function 620. In the example illustrated in FIG. 11, to increase the image intensity of the image of the defect region 212, initial repair regions 1110A and 1112A in the area 1104 and initial repair region 1114A in the area 1108 are provided for the simulation.

Referring to the example of FIG. 12, the simulation modifies the initial repair regions using a model-based approach to determine the repair regions. In some embodiments, the model-based approach is applied according to simulation results of an empirical model, which is characterized by empirical semiconductor wafer data and test patterns. In some embodiments, the model-based approach includes an imaging model that incorporates the point spread function of the imaging system as discussed above with reference to FIGS. 6B, 6C, 7A, 7B, 8A, 8B, 9A, and 9B, and calculates the aerial image intensity of the main feature and/or the defect region based on the phase and amplitude distribution of the defect region.

In some embodiments, the model-based approach includes a developing model of a layer of resist comprising a conversion from image intensity to a resist pattern. The layer of resist may comprise multi-layer films such as a top anti-reflective coating (TAR) film, a bottom anti-reflective coating film (BARC), and a resist film. The conversion may be related to a film resist response function having information of resist response to light. The response of the resist may include response to exposure intensity, exposure time, and response radius. The conversion may be related to a resist development function, reflecting the impact on the final resist pattern of the development process. In some embodiments, convolution terms of the imaging model may be modified to incorporate the conversion from an aerial image to a resist pattern, such that an image intensity function of the imaging model may represent a resist pattern after an exposure and development process.

Referring to the example of FIG. 12, illustrated therein are repair regions 1110B, 1112B, and 1202 determined by the simulation after applying the model-based approach to the initial repair regions. In the illustrated example, the repair region 1110B is formed by adding a pixel 1204 to and removing pixels 1206, 1208, 1210, and 1212 from the initial repair region 1110A of FIG. 11. The repair region 1112B is formed by removing pixels 1214, 1216, and 1218. The initial repair region 1114A is removed, and a repair region 1202 is added.

It is noted that while specific examples of the phase and amplitude distributions of the defect region are provided, these are merely examples and are not intended to be limiting. In various embodiments, the aerial image of the defect region may have any phase distributions (e.g., having a phase that is between 0 and 180 degrees or greater than 180 degrees, or having different phases for different portions of the aerial image) and amplitude distributions, and the simulation discussed above with reference to FIGS. 11 and 12 may be used to identify repair regions such that the image intensity of the defect region satisfies a required intensity range. Furthermore, the configurations of the repair regions are exemplary only and not intended to be limiting. It will be understood by those skilled in the art that other configurations may be used, and the repair regions may be of various shapes including squares, rectangles, circles, ovals, pentagons, hexagons, and any other suitable shapes.

Figure 13:
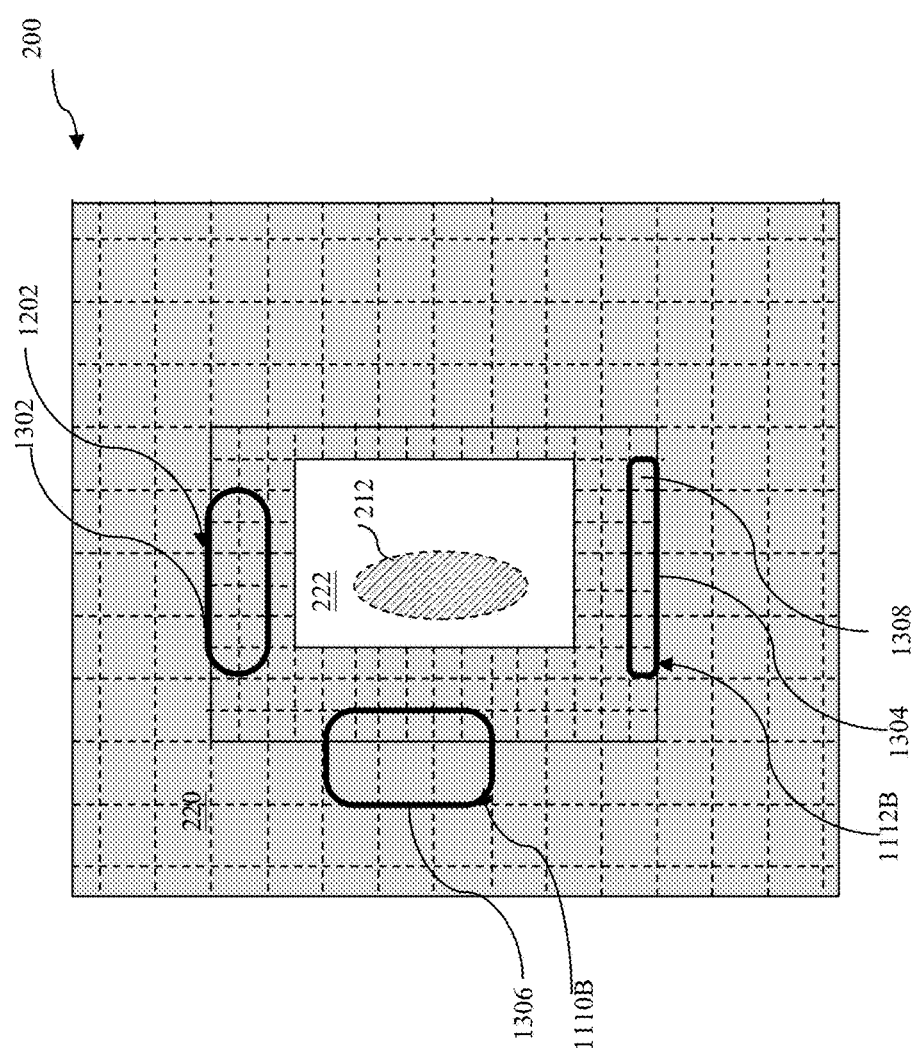
FIG. 13 is a diagrammatic top view of a portion of a mask including repair regions according to some embodiments.

Referring to FIGS. 1A and 13, the method 100 then proceeds to block 112, where mask repair contours are determined based on the repair regions 1110B, 1112B, and 1202, and a mask repair model of a mask repair tool. In some embodiments, the mask repair model includes various parameters of the mask repair tool including, for example, etching characteristics (e.g., speed, selectivity) and repair accuracies for different shapes. In some examples, the mask repair model provides that the mask repair tool achieves higher repair accuracy for forming particular shapes, for example, circles and ovals compared to rectangles. In such examples, mask repair contours 1302, 1304, and 1306 for the repair regions 1110B, 1112B, and 1202 are modified according to those particular shapes to include rounded corners where the mask repair model indicates. In some examples, the repair regions 1110B, 1112B, and 1202 may be modified according to the changes to the mask repair contours. In an example, a pixel 1308 is added to the repair region 1112B to compensate for the changes of the mask repair contours 1302, 1304, and 1306.

Referring to FIGS. 1A and 14, the method 100 proceeds to block 114, where a repair process is performed to the repair regions. Illustrated in FIG. 14 is a mask 200 after the a repair process has been performed to the repair regions 1110B, 1112B, and 1302, where the absorption layer 220 in repair regions 1110B, 1112B, and 1202 is removed to form repair features 1402, 1404, and 1406 respectively. The repair process may include focused ion-beam etching or focused-electron-beam-induced etching performed by a mask repair tool. The capping layer 206 is exposed through the repair features 1402, 1404, and 1406. The repair features 1402, 1404, and 1406 provide additional reflected radiation to compensative for the intensity loss caused by the defect region 212, and restores the corresponding resist pattern formed on a target (e.g., a wafer substrate).

In some examples, the defect on the mask 200 is considered to have been repaired by the repair regions if the resist pattern defect corresponding to the defect region 212 is small and within the specification (e.g., the resist pattern defect has a width that is less than about 3 nm). In various embodiments, the sizes and the shapes of the repair features are selected such that the radiations reflected by the repair features do not exceed the exposure threshold for a photoresist material disposed on the target, and such repair features are also referred to as sub-resolution repair features.

Referring to FIGS. 15A, 15B, 15C, 15D, 16A, 16B, 16C, 16D, 17A, 17B, 17C, 17D, 18A, 18B, 18C, and 18D, various types of masks may be repaired using the method 100. FIGS. 15A, 15B, 15C, 15D, 16A, 16B, 16C, 16D illustrate a mask 1500 repaired using the method 100. FIGS. 17A, 17B, 17C, 17D, 18A, 18B, 18C, and 18D illustrate a phase shift mask 1700 repaired using the method 100.

Referring now to the example of FIGS. 15A and 15B, a binary mask 1500 including a defect region 1504 in a feature 222 is provided. In some embodiments, the mask 1500 includes a substrate 1502 including fused silica (SiO$_2$) fused quartz, calcium fluoride, or other suitable material. In some embodiments, the binary mask 1500 includes an absorption layer 1508, which may include a single layer or multiple layers of material selected from the group consisting of chromium (Cr), chromium oxide (CrO), titanium nitride (TiN), tantalum nitride (TaN), tantalum (Ta), titanium (Ti), aluminum-copper (Al—Cu), palladium, tantalum boron nitride (TaBN), aluminum oxide (AlO), molybdenum (Mo), and other suitable materials. In the specific embodiment of the mask 1500 shown in FIGS. 15A and 15B, the absorption layer 1508 is patterned according to an IC layout to include a feature 222. When an incident radiation 1510 is projected onto the mask 1500, the patterned absorption layer 1508 absorbs the radiation, thereby forming a patterned radiation 1512. To further this embodiment, the mask 1500 is found to have a defect region 1504 (e.g., having a bump), where the patterned radiation 1512 passing through the defect region 1504 does not have the desired phase and/or amplitude.

Referring to the examples of FIGS. 15C and 15D, illustrated are normalized amplitude and intensity distributions of a focal plane aerial image of the defect region 1504 respectively. In a particular example, the aerial image of the defect region 1504 has a maximum normalized amplitude value 1520 of about 1.2, a phase of about 90 degrees, and a maximum normalized intensity value 1524 of about 1.44.

Figure 16B:
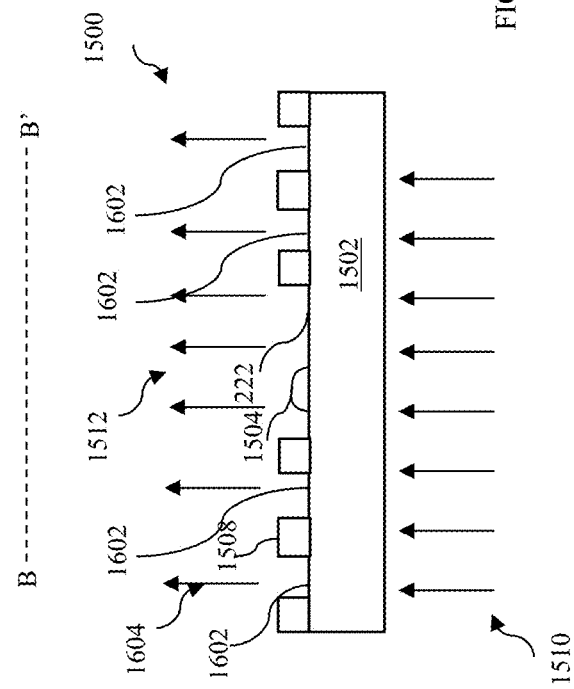
FIG. 16B is a cross-sectional view of a portion of the mask of FIG. 16A according to some embodiments.
Figure 16D:
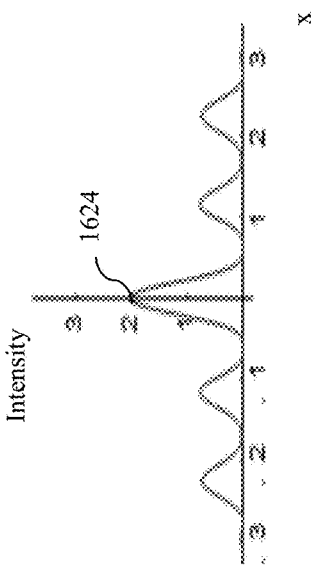
FIG. 16D is an intensity distribution of the defect region of the mask of FIG. 14A according to some embodiments.
Figure 16A:
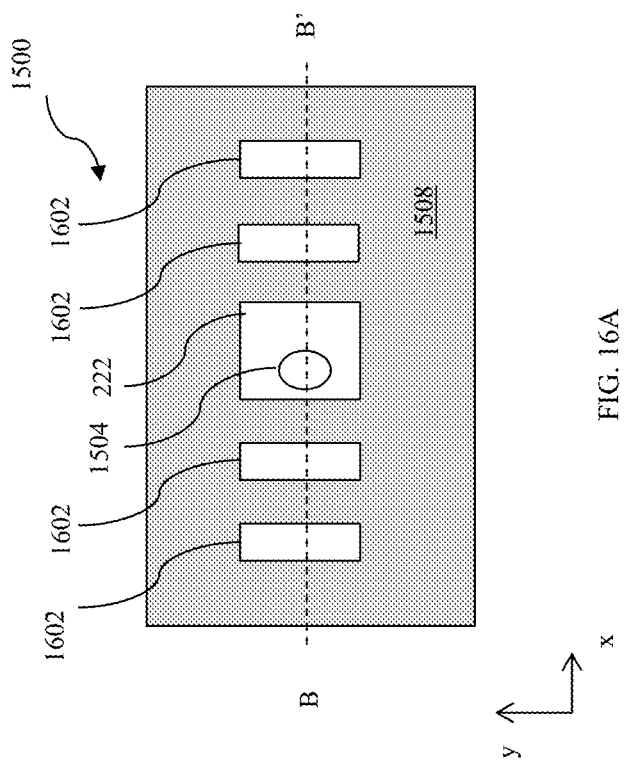
FIG. 16A is a top view of a portion of the mask of FIG. 15A after repair features are formed according to some embodiments.

Referring to FIGS. 16A, 16B, 16C, and 16D, in some embodiments, a method 100 is performed to repair the mask 1500. For example, at block 110 of the method 100, repair regions are determined based on the point spread function of the imaging system and phase and amplitude distributions of an aerial image of the defect region 1504. Referring to FIGS. 16A, 16B, illustrated is the mask 1500 after the method 100 has been performed to the mask 1500 to repair the defect region. Repair features 1602 are formed on the mask 1500 by removing the absorption layer 1508 in the regions of the repair features 1602. Radiation 1604 passing through the repair features 1602 compensates for the intensity loss caused by the defect region 1504.

Figure 16C:
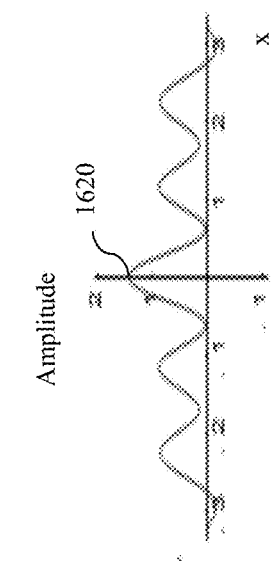
FIG. 16C is an amplitude distribution of the defect region of the mask of FIG. 16A according to some embodiments.

Referring to the examples of FIGS. 16C and 16D, illustrated are normalized amplitude and intensity distributions of a focal plane aerial image of the defect region 1504 respectively after the repair features have been added to the mask 1500. In a particular example, the aerial image of the defect region 1504 has a maximum normalized amplitude value 1620 of about 1.4 (with an increase of about 17% from the maximum normalized amplitude value 1520), and a maximum normalized intensity value 1624 of about 2 (with an increase of about 36% from the maximum normalized intensity value 1524).

Figures 17A, 17B, 17C, 17D:
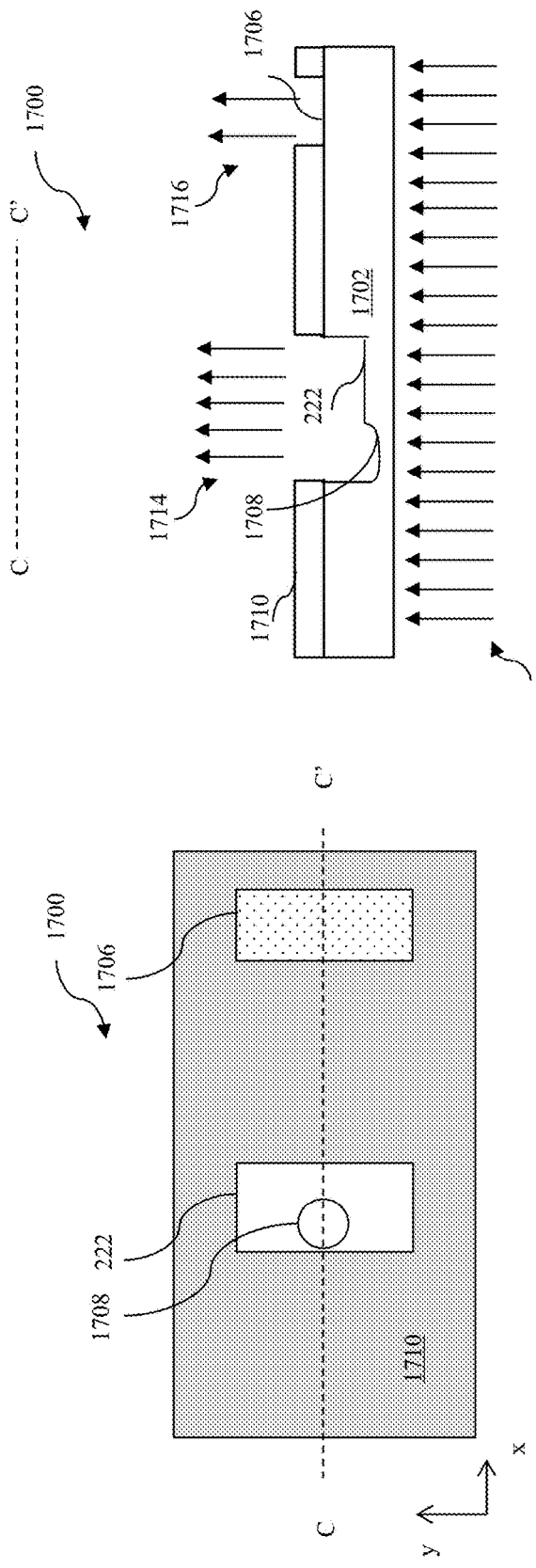
FIG. 17A is a top view of a portion of a mask according to some embodiments.
FIG. 17B is a cross-sectional view of a portion of a mask of FIG. 17A according to some embodiments.
FIG. 17C is an amplitude distribution of a defect region of the mask of FIG. 17A according to some embodiments.
FIG. 17D is an intensity distribution of the defect region of the mask of FIG. 17A according to some embodiments.

Referring now to the example of FIGS. 17A and 17B, an alternating phase-shift mask 1700 including a defect region 1708 in a feature 222 is provided. In such examples, the feature 222 corresponds to a phase shift region, and is also referred to as a phase shift region 222. In some embodiments, the mask 1700 includes a substrate 1702 including fused silica (SiO$_2$), fused quartz, calcium fluoride, or other suitable material. The substrate 1702 includes the phase shift region 222 and a non-phase-shifting region 1706. The radiation 1714 passing through the phase shift region 222 is phase-shifted by about 180 degrees from the radiation 1716 passing through the non-phase-shifting region 1706. Circuit features may be formed on a wafer with radiations (e.g., radiation 1714 and 1716) passing the neighboring regions that are 180 degrees out of phase. To further this embodiment, the mask 1700 is found to have a defect region 1708 (e.g., a dip) in the phase shift region 222, and the radiation 1714 passing through the defect region 1708 does not have the desired phase.

Referring to the examples of FIGS. 17C and 17D, illustrated are normalized amplitude and intensity distributions of a focal plane aerial image of the defect region 1708 respectively. In a particular example, the aerial image of the defect region 1708 has a maximum normalized amplitude value 1720 of about 1.2, a phase of about 45 degrees, and a maximum normalized intensity value 1724 of about 1.44.

Referring to FIGS. 18A, 18B, 18C, and 18D, in some embodiments, a method 100 is performed to repair the mask 1700. For example, at block 110 of the method 100, repair regions are determined based on the point spread function of the imaging system and phase and amplitude distributions of an aerial image of the defect region 1708. In such embodiments where the mask 1700 is a phase shifting mask, at block 110, it is further determined (e.g., by a simulation using a phase shifting mask model) that different repair features corresponding to the different repair regions may have different thickness, so that radiations passing through these repair features may have different phases (e.g., about 180 degrees out of phase). Referring to FIGS. 18A, 18B, 18C, and 18D, illustrated is the mask 1700 after the method 100 has been performed to repair the defect region 1708. Repair features 1802 and 1804 are formed on the mask 1700 by removing the absorption layer 1710 in the repair regions. Furthermore, repair features 1802 have a thickness that is different from a thickness of the repair features 1804, such that radiations passing through the repair features 1802 and the repair features 1804 are about 180 degrees out of phase. In an example, the radiations passing through the repair features 1804 have the same phase as the radiation passing through the non-phase-shifting region 1706.

Referring to the examples of FIGS. 18C and 18D, illustrated are normalized amplitude and intensity distributions of a focal plane aerial image of the defect region 1708 respectively after the repair features have been added to the mask 1700. In a particular example, the aerial image of the defect region 1708 has a maximum normalized amplitude value 1820 of about 1.9 (with an increase of about 58% from the maximum normalized amplitude value 1720), and a maximum normalized intensity value 1824 of about 3.6 (with an increase of about 192% from the maximum normalized intensity value 1724).

The embodiments of the present disclosure offer advantages over existing art, although it is understood that different embodiments may offer different advantages, not all advantages are necessarily discussed herein, and that no particular advantage is required for all embodiments. One of the advantages of some embodiments is that a defect in a mask may be repaired by forming repair features in non-defect regions surrounding a defect region to compensate for image intensity loss caused by the defect. Furthermore, by using the oscillation pattern of a point spread function of an imaging system, repair regions may be determined efficiently and effectively using a simulation. Moreover, by using a combination of the rule-based approach and the model-based approach in the simulation, the number of iterations for the simulation may be reduced while identifying optimized repair regions for achieving the desired pattern a target.

Thus, one aspect of the present disclosure involves a mask repairing method. A mask is inspected to locate a defect region for a defect of the mask. A phase distribution of an aerial image of the defect region is acquired. A point spread function of an imaging system is determined. One or more repair regions of the mask are identified based on the phase distribution of the aerial image of the defect region and the point spread function. A repair process is performed to the one or more repair regions of the mask to form one or more repair features.

Another aspect of the present disclosure involves a method including receiving a patterned extreme ultraviolet (EUV) mask. The patterned EUV mask includes an absorption region including an absorption material, a reflective region defining a main feature, and a defect. A defect region resulting from the defect and intruding the reflective region is determined. A phase distribution of an image of the defect region is acquired. A point spread function of an imaging system is provided. A repair region in the absorption region is determined according to the point spread function and the phase distribution of the image of the defect region. The absorption material of the repair region is removed, using a mask repair tool, to form a repair feature.

Yet another aspect of the present disclosure involves a method including receiving a mask including a print feature and a defect. The mask is inspected to locate a defect region for the defect. A point spread function of the imaging system is determined. A repair region of the mask is identified based on the point spread function and the defect region. A repair process is performed, using a mask repair tool, to the repair region of the mask to form a repair feature. The mask is exposed to radiation in the imaging system to produce a first radiation from the print feature and a second radiation from the repair feature. The first radiation and the second radiation are used to expose a photoresist of a target.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of repairing a mask, the method comprising:
   inspecting a mask to locate a defect region for a defect of the mask;
   acquiring a phase distribution of an aerial image of the defect region in an imaging system;
   determining a point spread function of the imaging system;
   identifying one or more repair regions of the mask based on the phase distribution of the aerial image of the defect region and the point spread function; and
   performing a repair process to the one or more repair regions of the mask to form one or more repair features.

2. The method of claim 1, wherein the identifying the one or more repair regions includes:
   identifying the one or more repair regions based on an oscillation pattern of the point spread function.

3. The method of claim 2, wherein the identifying the one or more repair regions based on the oscillation pattern of the point spread function includes:
   determining a first region surrounding the defect region based on a main lobe of the point spread function;
   determining a second region surrounding the first region based on a first side lobe of the point spread function adjacent to the main lobe; and determining a third region surrounding the second region based on a second side lobe of the point spread function adjacent to the first side lobe;
wherein each repair region is located in one of the first, second, and third regions.

4. The method of claim 3, wherein the aerial image of the defect region has a phase that is substantially equal to 180 degrees, and
wherein a first repair region is located in the second region.

5. The method of claim 4, wherein the identifying the one or more repair regions based on the oscillation pattern of the point spread function includes:
determining a fourth region surrounding the third region based on a third side lobe of the point spread function adjacent to the second side lobe; and
wherein a second repair region is located in the fourth region.

6. The method of claim 3, wherein the aerial image of the defect region has a phase that is substantially equal to zero, and
wherein the one or more repair regions are located in at least one of the first region and third region.

7. The method of claim 2, wherein the identifying the one or more repair regions includes:
modifying the one or more repair regions using a pattern transfer model of a pattern transfer process for transferring a feature defined in the mask to a wafer.

8. The method of claim 1, wherein the identifying the one or more repair regions includes:
representing the mask using a plurality of pixels; and
defining the one or more repair regions using one or more pixels.

9. The method of claim 8, wherein the representing the mask using the plurality of pixels includes:
representing a first region of the mask surrounding the defect region using a plurality of first pixels, wherein each first pixel has a first size; and
representing a second region of the mask surrounding the first region using a plurality of second pixels, wherein each second pixel has a second size greater than the first size.

10. A method, comprising:
receiving a patterned extreme ultraviolet (EUV) mask, the patterned EUV mask including an absorption region including an absorption material, a reflective region defining a main feature, and a defect;
determining a defect region resulting from the defect and intruding the reflective region;
acquiring a phase distribution of an image of the defect region;
providing a point spread function of an imaging system;
determining a repair region in the absorption region according to the point spread function and the phase distribution of the image of the defect region; and
removing the absorption material of the repair region, using a mask repair tool, to form a repair feature.

11. The method of claim 10, wherein the patterned EUV mask includes:
a low thermal expansion material (LTEM) substrate;
a reflective multilayer over the LTEM substrate;
a buffer layer over the reflective multilayer; and
a patterned absorption layer over the buffer layer to form the absorption region, wherein an opening in the patterned absorption layer exposes the buffer layer to form the reflective region.

12. The method of claim 11, wherein the acquiring the phase distribution of the image of the defect region includes:
generating a surface profile of the defect region;
providing a film deposition model for the reflective multilayer and the buffer layer of the mask;
determining deformation data of the reflective multilayer and the buffer layer based on the surface profile using the film deposition model; and
generating the phase distribution of the image of the defect region using the deformation data.

13. The method of claim 10, wherein the acquiring the phase distribution of the image of the defect region includes:
obtaining a first intensity distribution of a first aerial image of the defect region at a first image plane of the imaging system, wherein the first image plane is located at a first distance from a focal plane of the imaging system;
obtaining a second intensity distribution of a second aerial image of the defect region at a second image plane of the imaging system, wherein the second image plane is located at a second distance from the focal plane of the imaging system; and
reconstructing the phase distribution of the image of the defect region using the first and second intensity distributions and the first and second distances.

14. The method of claim 13, wherein the obtaining the first intensity distribution and second intensity distribution includes:
obtaining the first intensity distribution and second intensity distribution using an actinic inspection tool configured according to the imaging system.

15. The method of claim 10, further comprising:
adjusting a contour of the repair region based on a mask repair model of the mask repair tool.

16. The method of claim 10, further comprising:
prior to the determining the phase distribution of the image of the defect region, removing a portion of the absorption region in the defect region.

17. A method, comprising:
receiving a mask including a print feature and a defect;
inspecting the mask to locate a defect region for the defect;
determining a point spread function of an imaging system;
identifying a repair region of the mask based on the point spread function and the defect region;
performing a repair process, using a mask repair tool, to the repair region of the mask to form a repair feature;
exposing the mask to radiation in the imaging system to produce a first radiation from the print feature and a second radiation from the repair feature; and
using the first radiation and the second radiation to expose a photoresist of a target.

18. The method of claim 17, wherein a first intensity of the first radiation is greater than a second intensity of the second radiation, and
wherein the second intensity of the second radiation is less than an exposure threshold of the photoresist of the target.

19. The method of claim 17, wherein a distance between the repair region and the defect is determined based on an oscillation pattern of the point spread function.

20. The method of claim 17, wherein the mask is a phase shift mask.

* * * * *